(12) United States Patent
Arai et al.

(10) Patent No.: US 9,570,602 B2
(45) Date of Patent: Feb. 14, 2017

(54) MANUFACTURING METHOD OF SEMICONDUCTOR DEVICE AND SEMICONDUCTOR DEVICE

(71) Applicant: Renesas Electronics Corporation, Tokyo (JP)

(72) Inventors: Koichi Arai, Tokyo (JP); Masaki Hama, Tokyo (JP); Yasuaki Kagotoshi, Tokyo (JP); Kenichi Hisada, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/095,469

(22) Filed: Apr. 11, 2016

(65) Prior Publication Data
US 2016/0225892 A1 Aug. 4, 2016

Related U.S. Application Data

(63) Continuation of application No. 14/750,196, filed on Jun. 25, 2015, now Pat. No. 9,337,327.

(30) Foreign Application Priority Data

Jun. 26, 2014 (JP) ................. 2014-131943

(51) Int. Cl.
*H01L 29/78* (2006.01)
*H01L 29/16* (2006.01)
*H01L 21/02* (2006.01)
*H01L 29/66* (2006.01)
*H01L 29/423* (2006.01)
(Continued)

(52) U.S. Cl.
CPC ..... *H01L 29/7811* (2013.01); *H01L 21/02236* (2013.01); *H01L 21/02378* (2013.01); *H01L 21/02529* (2013.01); *H01L 21/049* (2013.01); *H01L 29/063* (2013.01); *H01L 29/0623* (2013.01); *H01L 29/1083* (2013.01); *H01L 29/1608* (2013.01); *H01L 29/42356* (2013.01); *H01L 29/66068* (2013.01); *H01L 29/66681* (2013.01); *H01L 29/66712* (2013.01);
(Continued)

(58) Field of Classification Search
None
See application file for complete search history.

(56) References Cited

U.S. PATENT DOCUMENTS 7,679,132 B2 3/2010 Yoshie
7,772,058 B2* 8/2010 Tanimoto ............ H01L 21/0485
257/288

(Continued)

FOREIGN PATENT DOCUMENTS

JP  2008-227172 A  9/2008

*Primary Examiner* — Minh-Loan Tran
(74) *Attorney, Agent, or Firm* — Mattingly & Malur, PC

(57) ABSTRACT

The present invention makes it possible to improve the accuracy of wet etching and miniaturize a semiconductor device in the case of specifying an active region of a vertical type power MOSFET formed over an SiC substrate by opening an insulating film over the substrate by the wet etching. After a silicon oxide film having a small film thickness and a polysilicon film having a film thickness larger than the silicon oxide film are formed in sequence over an epitaxial layer, the polysilicon film is opened by a dry etching method, successively the silicon oxide film is opened by a wet etching method, and thereby the upper surface of the epitaxial layer in an active region is exposed.

9 Claims, 14 Drawing Sheets

(51) Int. Cl.
*H01L 21/04* (2006.01)
*H01L 29/06* (2006.01)
*H01L 29/10* (2006.01)

(52) U.S. Cl.
CPC ...... *H01L 29/7801* (2013.01); *H01L 29/7802* (2013.01); *H01L 29/7816* (2013.01)

(56) References Cited

U.S. PATENT DOCUMENTS

| | | | |
|---|---|---|---|
| 2002/0008282 A1 | 1/2002 | Kubo et al. | |
| 2003/0107041 A1* | 6/2003 | Tanimoto | H01L 29/66068 257/77 |
| 2005/0062048 A1* | 3/2005 | Hayashi | H01L 29/7828 257/77 |
| 2013/0299849 A1 | 11/2013 | Tega et al. | |

* cited by examiner

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2014-131943 filed on Jun. 26, 2014 including the specification, drawings and abstract is incorporated herein by reference in its entirety.

BACKGROUND

The present invention relates: to a semiconductor device, and in particular to a technology effectively applicable to a semiconductor device including a silicon carbide substrate, and a manufacturing method thereof.

A semiconductor power device is required to have a low on resistance and a low switching loss in addition to a high withstanding voltage but the performance of a silicon (Si) power device that currently is the mainstream is coming close to its theoretical limits. Silicon carbide (SiC) has a breakdown field strength about one digit larger than Si and hence the resistance of a device can be reduced theoretically by not less than three digits by reducing the thickness of a drift layer to retain withstanding voltage to about one tenth and increasing an impurity concentration by about a hundred times. Further, SiC has a band gap about three times larger than Si and hence can withstand high temperature operation and an SiC semiconductor device is expected to have performance exceeding an Si semiconductor device.

With attention focused on the advantages of SiC, the research and development of a DMOS (Double-Diffused MOSFET) as a power MOSFET (Metal Oxide Semiconductor Field Effect Transistor) of a high withstanding voltage has been advanced.

An example of a manufacturing method of a DMOS is described in Patent Literature 1 (Japanese Unexamined Patent Application Publication No. 2008-227172). It describes that a stepped section that is an insulating film having a film thickness larger than a gate insulating film is formed beside the gate insulating film by a thermal oxidization method by making use of the accelerated oxidation characteristic of an amorphous layer as a substrate.

CITATION LIST

Patent Literature

Patent Literature 1: Japanese Unexamined Patent Application Publication No. 2008-227172

SUMMARY

In a DMOS including a gate insulating film and a gate electrode stacked over a substrate, it is conceivable to form an insulating film having a film thickness larger than the gate insulating film and playing the role of element isolation and the like (hereunder merely called a field insulating film) over the substrate in a field region beside the gate insulating film. Here, since the thermal oxidation rate of SiC is extremely slower than that of Si, it is difficult to form a field insulating film having a LOCOS (Local Oxidation of Silicon) structure and a sufficiently large thickness. To cope with that, it is conceivable to form a thin gate insulating film in an active region and a thick field insulating film separately by depositing an insulating film having a sufficiently large film thickness over a substrate, successively removing the insulating film selectively by wet etching, and thus forming the gate insulating film.

By a patterning method using wet etching however, the accuracy of the patterning is low and a tapered opening is formed in a processed insulating film. As a result, the processing of a relatively thick insulating film by wet etching as stated above causes a semiconductor device to be hardly miniaturized.

Other objects and novel features will be obvious from the descriptions and attached drawings in the present specification.

The outlines of representative embodiments in the embodiments disclosed in the present application are briefly explained as follows.

A manufacturing method of a semiconductor device according to an embodiment is to specify an active region of a MOSFET by forming a silicon oxide film having a small film thickness and a polysilicon film having a film thickness larger than the silicon oxide film in sequence over an SiC substrate, thereafter opening the polysilicon film by a dry etching method, and successively opening the silicon oxide film by a wet etching method.

Further, a semiconductor device according to an embodiment is a semiconductor device having a source region and a channel region formed side-by-side over the upper surface of an epitaxial layer over an SiC substrate and a gate electrode formed over the channel region with a gate insulating film interposed, a part of the gate electrode being embedded right under an eaves-like protruding sidewall of an insulating film formed beside the gate electrode.

According to an embodiment disclosed in the present application, it is possible to improve the performance of a semiconductor device. In particular, it is possible to materialize the miniaturization of a semiconductor device.

DETAILED DESCRIPTION

Figure 1:
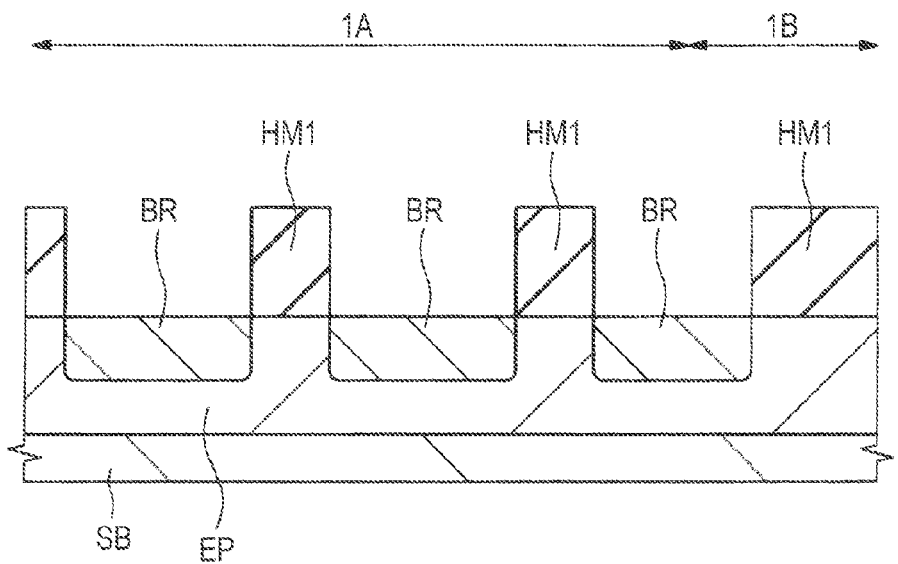
FIG. 1 is a sectional view showing a manufacturing method of a semiconductor device according to Embodiment 1 of the present invention.

Embodiments according to the present invention are hereunder explained in detail in reference to the drawings. Here, in all the drawings for explaining the embodiments, members having identical function are represented with an identical code and are not explained repeatedly. Further, in the following embodiments, identical or similar parts are not explained repeatedly in principle except when particularly needed. Furthermore, in the drawings for explaining the embodiments, hatching may sometimes be applied even in a plan view, a perspective view, or another view in order to make a configuration easy to understand.

In addition, the code "−" or "+" represents a relative concentration of impurities having an conductivity type of an n-type or a p-type and, in the case of n-type impurities for example, the impurity concentration increases in the order of "$n^{--}$", "$n^{-}$", "$n$", "$n^{+}$", and then "$n^{++}$".

Meanwhile, in the present application, a substrate mainly containing silicon carbide (SiC) is merely called an SiC substrate. Further, in the present application, an SiC substrate and an epitaxial layer formed thereover may be combined and called a substrate in some cases. Furthermore, "an end" or "a terminal" cited in the present application means an end of a structure such as a film in the direction along the main surface of an SiC substrate. In addition, "a width" cited in the present application means a length from an end to the other end of a structure such as a film in the direction along the main surface of an SiC substrate.

Embodiment 1

A manufacturing method of a semiconductor device according to the present embodiment is explained in the order of the steps in reference to FIGS. 1 to 13. FIGS. 1 to 13 are sectional views explaining the manufacturing steps of a semiconductor device according to the present embodiment. In the sectional views shown in FIGS. 1 to 13, the region on the left side in each of the sectional views is an element region 1A where a plurality of MOSFETs are formed and the region on the right side in each of the sectional views is a termination region 1B that is a peripheral region of a semiconductor chip. That is, the left side in each of the sectional views represents a region on the center side of the semiconductor chip formed through a relevant manufacturing step and the right side in each of the sectional views represents a region that comes to be the peripheral section of the semiconductor chip.

Firstly, as shown in FIG. 1, an $n^{+}$-type SiC substrate SB is provided. N-type impurities are introduced into the SiC substrate SB at a relatively high concentration. The n-type impurities comprise nitrogen (N) for example and the concentration of the n-type impurities is $1 \times 10^{19}$ cm$^{-3}$ for example.

Successively, an epitaxial layer EP that is an $n^{-}$-type semiconductor layer comprising SiC is formed over the main surface of the SiC substrate SB by an epitaxial growth method. The epitaxial layer EP contains n-type impurities at an impurity concentration lower than the SiC substrate SB. The impurity concentration of the epitaxial layer EP depends on the rated withstanding voltage of an element and is $1 \times 10^{16}$ cm$^{-3}$ for example. The epitaxial layer EP comes to be a route of electric current flowing vertically in a MOSFET formed later. That is, the epitaxial layer EP is a layer including a drift layer of a semiconductor device.

Successively, a patterned insulating film HM1 is formed over the upper surface of the epitaxial layer EP. The insulating film HM1 is a film intermittently exposing the upper surface of the epitaxial layer EP in the element region 1A. The insulating film HM1 is comprised of $SiO_2$ (silicon oxide) or the like for example and concretely is comprised of a TEOS (Tetra Ethyl Ortho Silicate) film or the like for example. The insulating film HM1 covers the most part of the upper surface of the epitaxial layer EP in the termination region 1B. The insulating film HM1 is formed by patterning an insulating film formed over the epitaxial layer EP by a CVD (Chemical Vapor Deposition) method by a photolithography technology and an etching method for example.

Successively, ions of p-type impurities (for example aluminum (Al)) are implanted into the epitaxial layer EP over which the insulating film HM1 is formed. As a result, a plurality of body regions (channel regions) BR that are $p^{-}$-type semiconductor regions are formed side-by-side over the upper surface of the epitaxial layer EP in the element region 1A. The depth of the body regions BP from the upper surface of the epitaxial layer EP, namely a junction depth, does not reach the lower surface of the epitaxial layer EP. At the ion implantation step, the insulating film HM1 is used as a hard mask.

Figure 2:
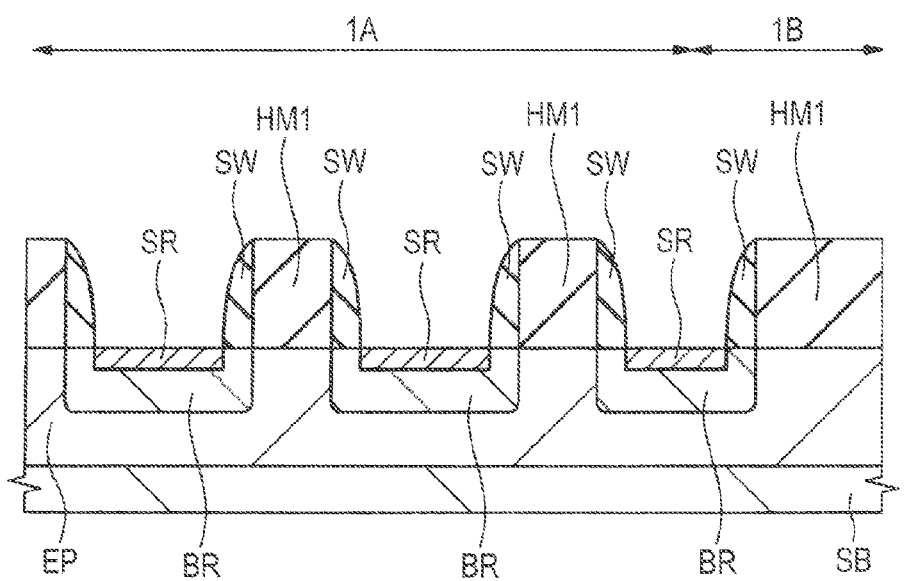
FIG. 2 is a sectional view showing a manufacturing method succeeding FIG. 1 of the semiconductor device.

Successively, as shown in FIG. 2, a sidewall SW is formed self-alignedly over each of the sidewalls of the insulating film HM1. The sidewalls SW are formed for example by forming a silicon oxide film over the epitaxial layer EP by a CVD method or the like, thereafter removing parts of the silicon oxide film by a dry etching method, thereby exposing the upper surface of the epitaxial layer EP, and thus leaving the silicon oxide film which is in contact with the sidewalls of the insulating film HM1. Here, it is estimated that the upper surface of the epitaxial layer EP at the sites exposed by the dry etching method is damaged through the dry etching step but, since the exposed sites of the epitaxial layer EP are not the regions to be channels of MOSFETs, the performance deterioration and the like of the MOSFETs are not concerned.

Successively, ions of n-type impurities (for example nitrogen (N)) are implanted into the upper surface of the epitaxial layer EP with the insulating film HM1 and the sidewalls SW used as masks. As a result, a plurality of source regions SR that are n+-type semiconductor regions are formed over the upper surface of the epitaxial layer EP. Each of the source regions SR is formed at the center section of the relevant body region BR in a planar view. That is, at the upper surface of the epitaxial layer EP, the parts of the epitaxial layer EP at which the body regions BR and the source regions SR are not formed exist between adjacent body regions BR, and each of the parts of the body regions BR having a width of about 0.5 μm is interposed between the relevant part of the epitaxial layer EP and the relevant source region SR. The depth of the source regions SR from the upper surface of the epitaxial layer EP is shallower than the depth at which the body regions BR are formed.

The body region BR formed on both the sides of each of the source regions SR at the upper surface of the epitaxial layer EP is a region that comes to be a channel that is an electric current route of a MOSFET that will be formed later. Here, a plurality of hard masks covering the upper surfaces of a plurality of channel regions, namely a plurality of sidewalls SW, are formed self-alignedly at equal intervals in order to equalize the widths (for example 0.5 μm) of the relevant channels with a high degree of accuracy. The n-type impurity concentration of the source regions SR is higher than the n-type impurity concentration of the epitaxial layer EP.

Figure 3:
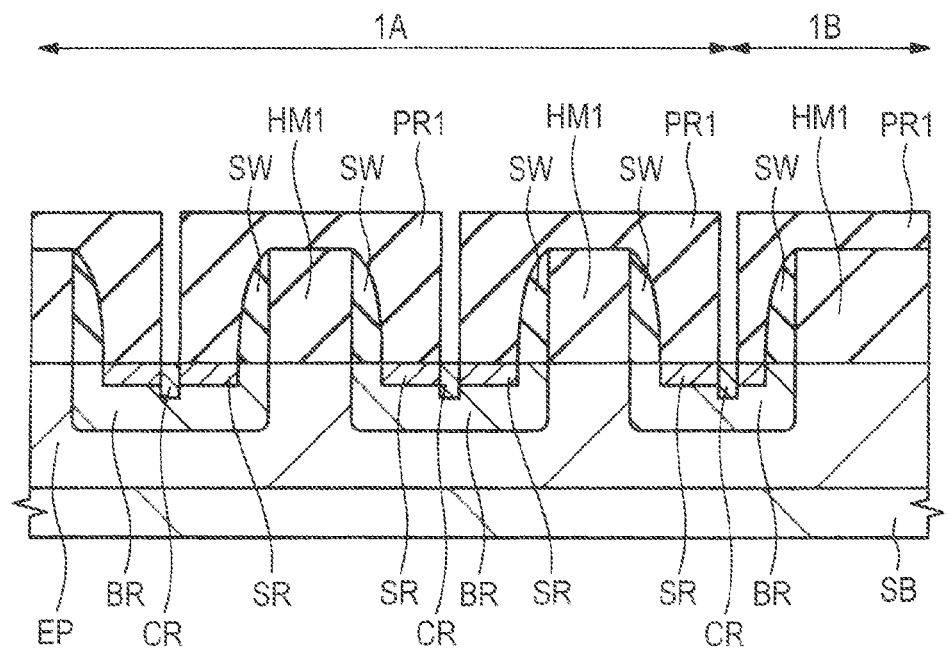
FIG. 3 is a sectional view showing a manufacturing method succeeding FIG. 2 of the semiconductor device.

Successively, as shown in FIG. 3, a photoresist film PR1 to cover the insulating film HM1 and the sidewalls SW and expose the center section of the upper surface of each of the source regions SR is formed over the epitaxial layer EP by a photolithography technology. The pattern of the photoresist film PR1 exposes the upper surface of the epitaxial layer EP at positions apart from opposing sidewalls SW between adjacent insulating films HM1 in the element region 1A.

Successively, ions of p-type impurities (for example aluminum (A)) are implanted at a relatively high concentration into the upper surface of the epitaxial layer EP exposed from the photoresist film PR1. As a result, a plurality of contact regions CR that are p+-type semiconductor regions are formed over the upper surface of the epitaxial layer EP in the element region 1A. Each of the contact regions CR is formed at the center section of the relevant source region SR in a planar view, namely at the center section of the relevant body region BR in a planar view.

The depth of the contact regions CR from the upper surface of the epitaxial layer EP is deeper than the depth at which the source regions SR are formed. Although the structure of forming the contact regions CR so as to be shallower than the depth at which the body regions BR are formed is shown in the figure, the depth at which the contact regions CR are formed may be deeper than the depth at which the body regions BR are formed. Each of the contact regions CR is a region formed for the purpose of electrically coupling the relevant body region BR with a metallic film (source electrode) that will be described later in order to fix the body regions BR to a prescribed potential (source potential). That is, the p-type impurity concentration of the contact regions CR is higher than the p-type impurity concentration of the body regions BR, and each of the contact regions CR and the relevant body region BR are in contact with each other.

Figure 4:
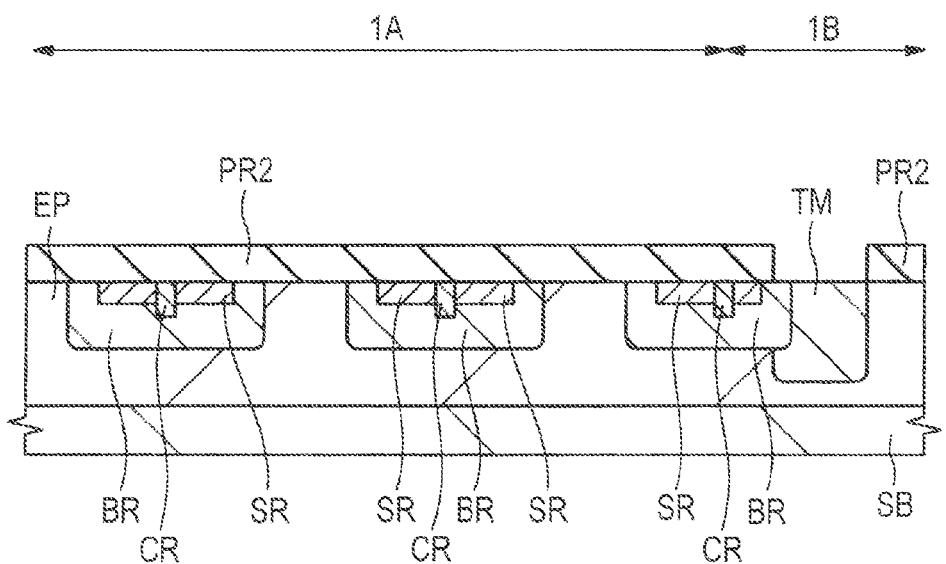
FIG. 4 is a sectional view showing a manufacturing method succeeding FIG. 3 of the semiconductor device.

Successively, as shown in FIG. 4, after the photoresist film PR1, the insulating film HM1, and the sidewalls SW are removed, a photoresist film PR2 to cover the element region 1A and expose a part of the termination region 1B is formed. Successively, ions of p-type impurities (for example aluminum (Al)) are implanted into the upper surface of the epitaxial layer EP at a relatively low concentration with the photoresist film PR2 used as a mask. As a result, a p−−-type semiconductor region TM is formed at the upper surface of the epitaxial layer EP in the termination region 1B.

The semiconductor region TM is in contact with a body region BR and is formed closer to the periphery of the semiconductor chip that is to be subsequently formed than the body region BR. Further, the semiconductor region TM is formed at a depth deeper than the body region BR. Otherwise, the depth of the semiconductor region TM may be comparable with the depth of the body region BR. Further, the semiconductor region TM does not reach the lower surface of the epitaxial layer EP.

In the termination region 1B, the body region BR and the semiconductor region TM having an impurity concentration lower than the body region BR are formed in the manner of being aligned in sequence in the direction of coming closer to the periphery of the semiconductor chip that is to be formed through a succeeding step. By forming such a JTE (Junction Termination Extension) structure, it is possible to: mitigate the electric field at the end of the semiconductor chip; and prevent the withstanding voltage of the device from deteriorating by electric field concentration.

Successively, after the photoresist film PR2 is removed, a carbon layer is formed so as to cover the SiC substrate SB and the epitaxial layer EP and thereafter the substrate including the SiC substrate SB and the epitaxial layer EP is activated by applying heat treatment at 1,700° C. to 1,800° C. The heat treatment is applied at a relatively high temperature and hence is applied before a gate electrode is formed. Successively, the carbon layer is removed.

Figure 5:
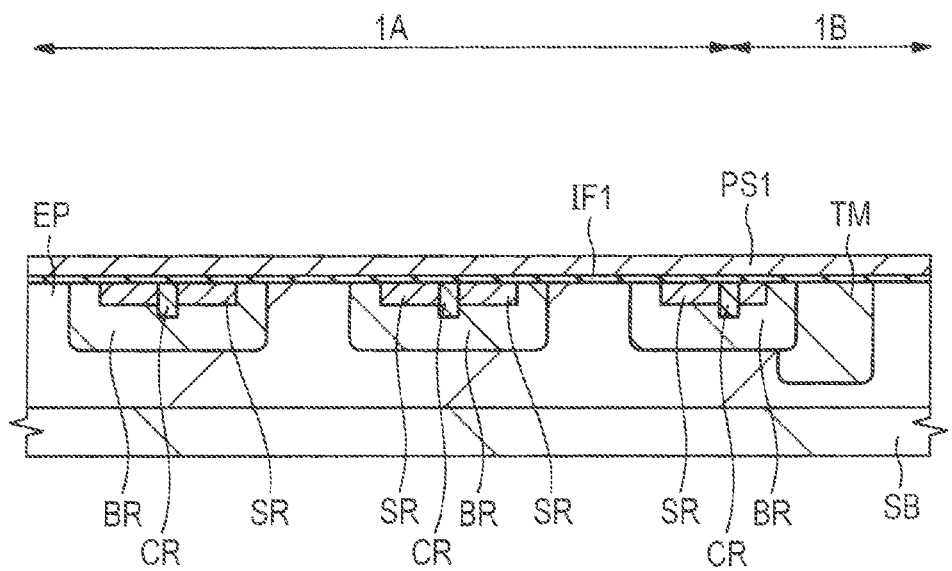
FIG. 5 is a sectional view showing a manufacturing method succeeding FIG. 4 of the semiconductor device.

Successively, as shown in FIG. 5, a silicon oxide film IF1 20 nm in thickness for example is formed over the whole surface of the epitaxial layer EP by a CVD method or the like for example. Successively, a polysilicon film PS1 100 nm in thickness for example is formed over the whole surface of the silicon oxide film IF1 by a CVD method or the like for example. The polysilicon film PS1 is comprised of a silicon (Si) film that is a semiconductor film having a higher oxidation rate than silicon carbide (SiC).

Figure 6:
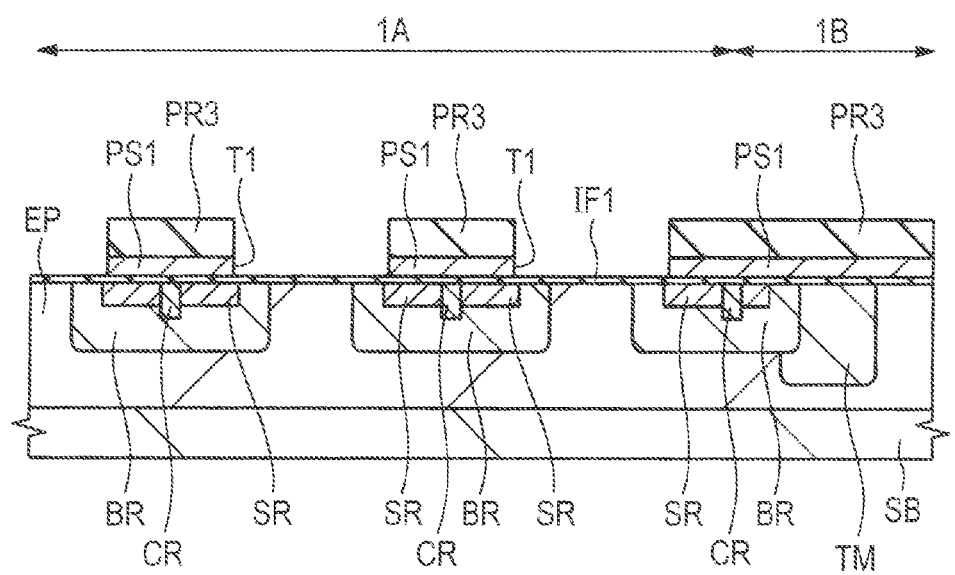
FIG. 6 is a sectional view showing a manufacturing method succeeding FIG. 5 of the semiconductor device.

Successively, as shown in FIG. 6, a pattern of a photoresist film PR3 is formed over the polysilicon film PS1 by a photolithography technology. The photoresist film PR3 is a resist pattern having openings right over the regions between adjacent source regions SR in the element region 1A. In the present application, a region between source regions SR, in which region a gate electrode is to be formed over a channel region through a gate insulating film in a succeeding step, is called an active region in some cases. Further, a region on both the sides interposing the active region, in which region an insulating film having a film thickness larger than the gate insulating film is formed beside the gate insulating film, is called a field region (element isolation region) in some cases.

Successively, the upper surface of the polysilicon film PS1 is exposed at the bottoms of a plurality of grooves T1 by applying dry etching with the photoresist film PR3 used as a mask, thus opening the polysilicon film PS1, and thereby forming the grooves T1. On this occasion, in order to prevent the upper surface of the epitaxial layer EP including the channel regions from being damaged by the dry etching, the upper surface of the epitaxial layer EP is not exposed at the dry etching step. That is, the silicon oxide film IF1 that is an insulating film is used as an etching stopper film.

Figure 7:
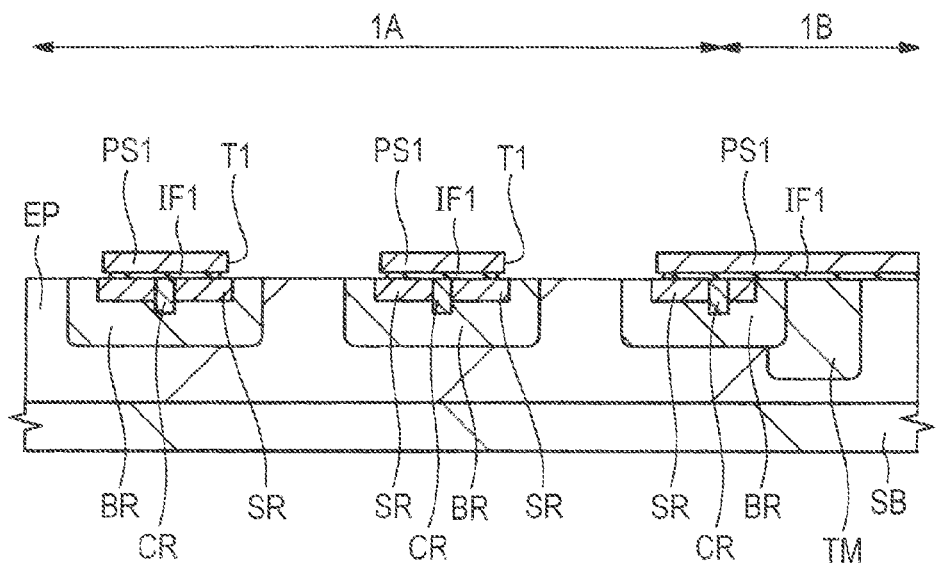
FIG. 7 is a sectional view showing a manufacturing method succeeding FIG. 6 of the semiconductor device.

Successively, as shown in FIG. 7, after the photoresist film PR3 is removed, parts of the silicon oxide film IF1 are removed and the upper surface of the epitaxial layer EP in the active region is exposed by applying wet etching with the polysilicon film PS1 used as a mask. As a result, the upper surface of the body region BR that is to be the channel region of each of the MOSFETs is exposed between the adjacent source regions SR. That is, the upper surfaces of the two body regions BR facing each other between adjacent source regions SR and the epitaxial layer EP between the two body regions BR are exposed.

Since not a dry etching method but a wet etching method is used here, it is possible to prevent the upper surfaces of the body regions BR that are to be the channel regions from being damaged. As a result, it is possible to prevent the performance deterioration such as the increase of off-current in the MOSFETs from being caused.

Further, processing by a wet etching method is a processing method having a relatively low positional accuracy of patterning. That is, when a mask pattern is formed at the upper part of a film to be etched and wet etching is applied, the arising problem is that the end of the film retracts inside the end of the mask pattern and the magnitude of the retraction can hardly be controlled.

In the present embodiment in contrast, since the film thickness of the silicon oxide film IF1 under the polysilicon film PS1 is about 20 nm and thus very small, it is possible to shorten the time of the wet etching applied for opening the silicon oxide film IF1 and exposing the upper surface of the epitaxial layer EP. As a result, it is possible to reduce the magnitude of the retraction of the film to be etched caused by the wet etching method to the minimum and hence it is possible to improve the processing accuracy of the etching. As a result, the width of the MOSFETs can be reduced and consequently the higher integration of the MOSFETs can be materialized.

Figure 8:
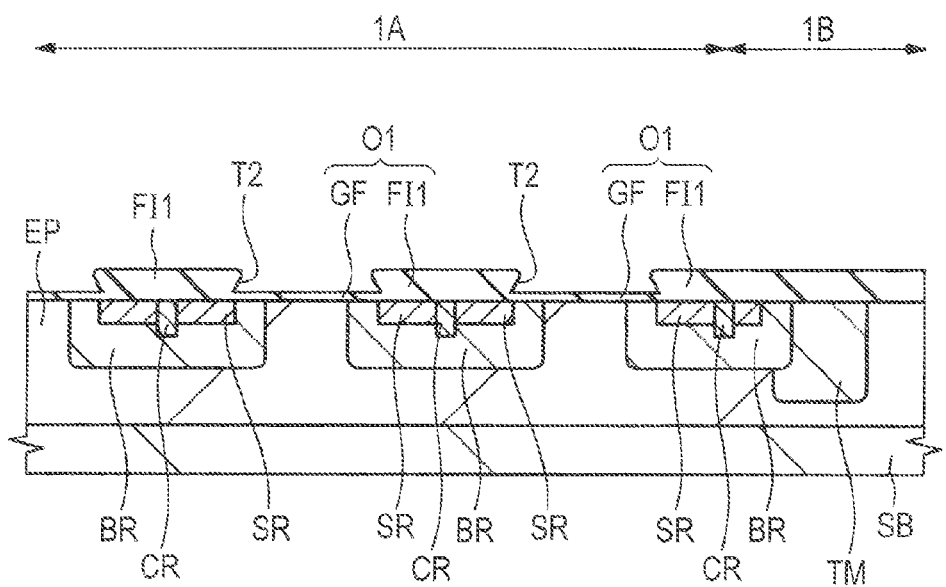
FIG. 8 is a sectional view showing a manufacturing method succeeding FIG. 7 of the semiconductor device.

Successively, as shown in FIG. 8, oxidation treatment is applied to the upper surface of the epitaxial layer EP exposed from the silicon oxide film IF1 at the bottoms of the grooves T1 and the polysilicon film PS1 by applying heat treatment to the whole structure including the epitaxial layer EP and the polysilicon film PS1. As a result, a gate insulating film GF is formed over the epitaxial layer EP exposed at the openings of the silicon oxide film IF1, namely over the upper surfaces of the body regions BR that are the channel regions in the regions adjacent to the source regions SR. Further, the gate insulating film GF is formed also over the epitaxial layer EP between the paired body regions BR exposed at the openings of the silicon oxide film IF1. The film thickness of the gate insulating film GF is about 50 nm for example.

Further, at the heat treatment step, the whole of the plural parts of the polysilicon film PS1 is oxidized and a field insulating film FI1 comprising a silicon oxide film is formed. The field insulating film FI1 is a film including an insulating film formed by oxidizing the polysilicon film PS1 and the silicon oxide film IF1 formed under the polysilicon films PS1 (refer to FIG. 7).

The polysilicon film PS1 is combined with oxygen (O) and comes to be a silicon oxide film through the heat treatment and the film thickness and the width increase. As a result, the film thickness of the field insulating film FI1 increases to about 250 nm for example. Consequently, over the epitaxial layer EP, the relatively thick field insulating film FI1 formed in the field region and the relatively thin gate insulating film GF formed in the active region are formed adjacently to and in contact with each other. Both the field insulating film FI1 and the gate insulating film GF are comprised of silicon oxide films respectively, and are coupled with each other to be integrated, and configure an oxide insulating film O1. A plurality of grooves T2 are formed at the positions corresponding to the plural grooves T1 (refer to FIG. 7) in the oxide insulating film O1, the grooves T2 do not pass through the oxide insulating film O1, the oxide insulating film O1 right under the grooves T2 configures the gate insulating film GF, and the oxide insulating film O1 of the sidewalls of the grooves T2 configure the field insulating film FI1.

Here, by oxidizing the thick polysilicon film PS1 over the silicon oxide film IF1, the ends of the field insulating film FI1 are formed so that the upper parts may overhang on the active region side at the boundary between the active region and the field region. That is, the ends of the field insulating film FI1 take an eaves-like shape over the upper surfaces of the body regions BR in the active region.

In other words, the ends of the field insulating film FI1 are formed right over the relevant ends of the gate insulating film GF respectively so as to be separated from and overhang the gate insulating film GF. As a result, the sidewalls of the field insulating film FI1 take an inversely-tapered shape. That is, the width of the field insulating film FI1 in the lateral direction, namely in the direction along the main surface of the SiC substrate SB, increases from the lower surface toward the upper surface. The ends of the upper surfaces of the field insulating film FI1 are located right over the active region. That is, the minimum angle between the upper surface of the gate insulating film GF or the upper surface of the epitaxial layer EP and the sidewalls of the field insulating film FI1 is an acute angle of less than 90 degrees.

Figure 9:
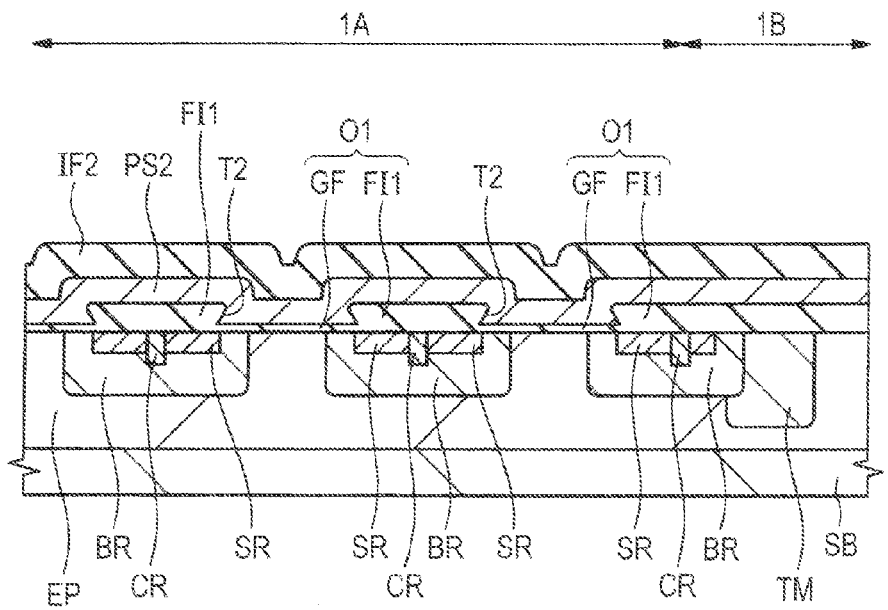
FIG. 9 is a sectional view showing a manufacturing method succeeding FIG. 8 of the semiconductor device.

Successively, as shown in FIG. 9, a polysilicon film PS2 and an insulating film IF2 are formed over the oxide insulating film O1 by a CVD method for example. Although the figure shows that the film thickness of the polysilicon film PS2 is smaller than the film thickness of the insulating film IF2, it is also possible that the film thickness of the polysilicon film PS2 is larger than the film thickness of the insulating film IF2. N-type impurities (for example phosphorus (P)) are introduced into the polysilicon film PS2.

Here, since the sidewalls of the field insulating film FI1 are formed in an eaves-like shape, a part of the polysilicon film PS2 deposited by a CVD method or the like is embedded into the region between the eaves sections at the ends of the field insulating film FI1 and the gate insulating film GF right under the eaves sections. As a result, the gate insulating film GF, the polysilicon film PS2, the field insulating film FI1, the polysilicon film PS2, and the insulating film IF2 are formed in sequence right over the upper surfaces of the parts of the body regions BR that are the channel regions.

Figure 10:
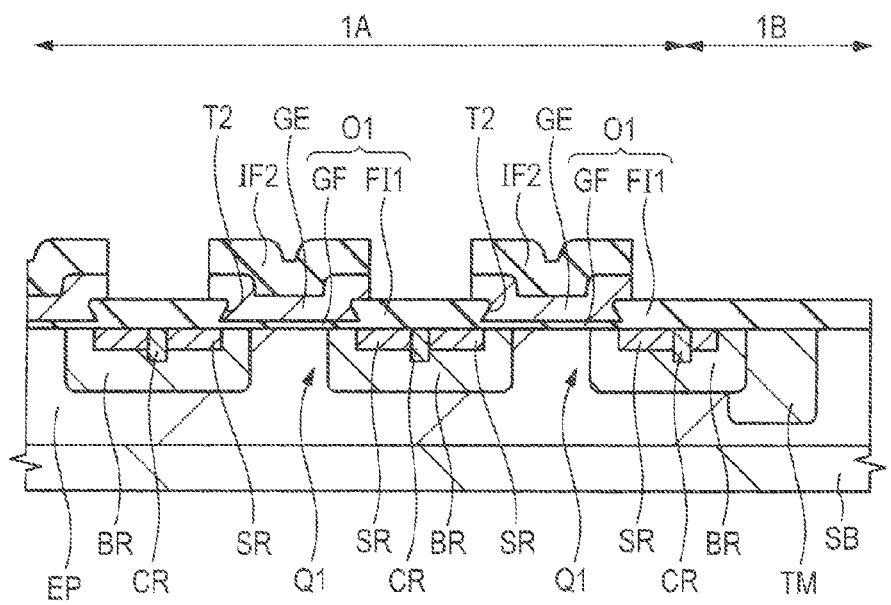
FIG. 10 is a sectional view showing a manufacturing method succeeding FIG. 9 of the semiconductor device.

Successively, as shown in FIG. 10, after the insulating film IF2 is patterned by a photolithography technology and a dry etching method, dry etching is applied with the insulating film IF2 used as a hard mask and thus the polysilicon film PS2 is patterned. As a result, a gate electrode GE comprising the polysilicon film PS2 is formed at plural sites. A part of the gate electrode GE is formed so as to fill the interiors of the grooves T2 right over the active region, namely right over the gate insulating film GF. That is, the gate electrode GE is formed so as to fill the gap between opposing two sections of the field insulating film FI1.

That is, the gate electrode GE being in contact with the upper surface of the gate insulating film GF is formed right over the body regions BR, namely the channel regions, exposed over the upper surface of the epitaxial layer EP adjacently to the source regions SR. Here, each of the ends of the upper surfaces of the field insulating film FI1 is located right over the relevant end of the gate insulating film GF in the active region and right over the gate electrode GE being in contact with the upper surface of the relevant end of the gate insulating film GF Further, another part of the gate electrode GE is formed so as to be in contact with the upper surfaces of the field insulating film FI1 adjacent to the active region outside the grooves T2. That is, the gate electrode GE is formed from right over the one part to right over the other part of the two parts of the field insulating film FI1 facing each other with the relevant groove T2 interposed. That is, the gate electrode GE and the insulating film IF2 terminate right over the field insulating film FI1. In other words, the gate insulating film GF, the gate electrode GE, the field insulating film FI1, and the gate electrode GE exist in sequence right over the ends of the upper surfaces of the body regions BR in the active region including the channel regions.

In this way, MOSFETs Q1 each of which comprises the gate electrode GE, the gate insulating film GF, the source region SR, the body region BR that is the channel region, the epitaxial layer EP including the drift layer, and the SiC substrate SB that is the drain region are formed. In each of the MOSFETs Q1, when a prescribed potential is applied to the gate electrode GE, a channel is formed in the body region BR right under the gate electrode GE, thereby the electrons in the source region SR adjacent to the channel pass through the upper surface (channel) of the body region BR, advance in the epitaxial layer EP in the vertical direction, and flow into the SiC substrate SB, namely into the drain region, and thus electric current flows in the direction opposite to the route.

That is, each of the MOSFETs Q1 is a planar gate type vertical MOSFET. Each of the MOSFETs Q1 is an n-channel type field effect transistor and a power MOSFET having a structure called a DMOS (Double-Diffused MOSFET).

When the polysilicon film PS2 is processed through the patterning step, the field insulating film FI1 has a film thickness larger than the gate insulating film GF and hence it is unnecessary to concern that the oxide insulating film O1 is penetrated by etching. Further, since the gate electrode GE is processed with the insulating film IF2 used as a hard mask here, it is possible to improve the processing accuracy of the gate electrode GE in the lateral direction.

Here, in the step for forming a MOSFET, it is conceivable to form an insulating film having the same film thickness as the gate insulating film even in the field region between elements without forming such a thick insulating film as the field insulating film FI1. If we try to form the gate electrode by processing the polysilicon film over the field region in such a structure however, in the case where the accuracy of etching is poor or the like, it is concerned that the insulating film in the field region is penetrated or gets thin, thereby short circuit or withstanding voltage drop is caused, and the MOSFET does not operate normally. Further, if the insulating film is penetrated, the upper surface of the epitaxial layer right under it is damaged.

In the present embodiment in contrast, by forming the field insulating film FI1 having a film thickness larger than the gate insulating film GF beside the gate insulating film GF, it is possible to facilitate the etching at the step for forming the gate electrode GE. Further, by forming the field insulating film FI1 having a large film thickness, it is possible to inhibit the electric field of a wire over the substrate from being transmitted to a semiconductor element. Furthermore, when elements (for example diodes or the like) other than MOSFETs that will be described later are formed over the substrate, the field insulating film FI1 having a comparatively large film thickness can be used as an element isolation layer and hence it is possible to electrically separate the elements from each other.

Here, in order to form the oxide insulating film O1 having film thicknesses different between the active region and the field region, the polysilicon film PS1 shown in FIG. 7 is formed and the upper surfaces of the polysilicon film PS1 and the epitaxial layer EP are oxidized respectively through the step explained in reference to FIG. 8. Such a manufacturing method is a feasible method because of the semiconductor device using not a bulk silicon (Si) but an SiC (silicon carbide) substrate.

That is, if we try to oxidize the polysilicon film PS1 and the substrate upper surface respectively as stated above over a bulk silicon (Si) substrate, the oxidation rate of the bulk silicon is larger than that of SiC and hence the whole of the polysilicon film PS1 having a large film thickness cannot be oxidized even when oxidation treatment for forming a thin gate insulating film over the substrate is applied. If the film thickness of the polysilicon film PS1 is reduced and the film thickness of the silicon oxide film IF1 under it is increased to cope with that, the problem of deteriorating the accuracy in the processing of the silicon oxide film IF1 by a wet etching method (refer to FIG. 7) arises.

In the present embodiment in contrast, by using an SiC substrate having an oxidation rate lower than a bulk silicon, it is possible to form the gate insulating film GF allowing the film thickness to be reduced in order to operate a MOSFET and the field insulating film FI1 having a film thickness necessary for facilitating the processing of the gate electrode GE as shown in FIG. 8.

Figure 11:
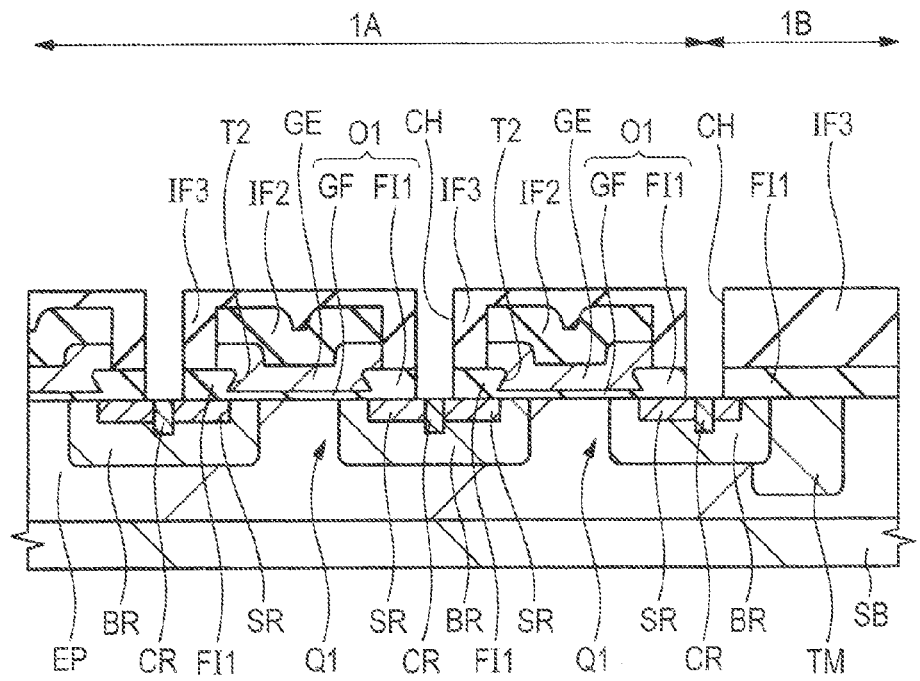
FIG. 11 is a sectional view showing a manufacturing method succeeding FIG. 10 of the semiconductor device.

Successively, as shown in FIG. 11, an interlayer insulating film IF3 comprising a silicon oxide film for example is formed over the epitaxial layer EP so as to cover the oxide insulating film O1, the gate electrode GE, and the insulating film IF2 by a CVD method or the like for example. Successively, by a photolithography technology and a dry etching method, parts of the interlayer insulating film IF3 and the oxide insulating film O1 are removed respectively, the upper surface of the epitaxial layer EP is exposed, and thereby a plurality of contact holes CH passing through the interlayer insulating film IF3 and the oxide insulating film O1 are formed.

Each of the contact holes CH is a hole that is formed at a position apart from the gate electrode GE between adjacent parts of the gate electrode GE and exposes the relevant contact region CR and a part of the relevant source region SR around it over the upper surface of the epitaxial layer EP. Each of the contact holes CH is formed at the center section of the relevant body region BR and the relevant source region SR in a planar view. Here, a contact hole to expose the upper surface of the gate electrode GE is also formed though it is not shown in the figure.

Successively, although it is not shown in the figure, a silicide layer is formed over the upper surfaces of the contact regions CR, the source regions SR, and the gate electrode GE, those being exposed at the bottom surfaces of the contact holes CH, by a known salicide technology. The silicide layer is comprised of NiSi (nickel silicide) for example.

Figure 12:
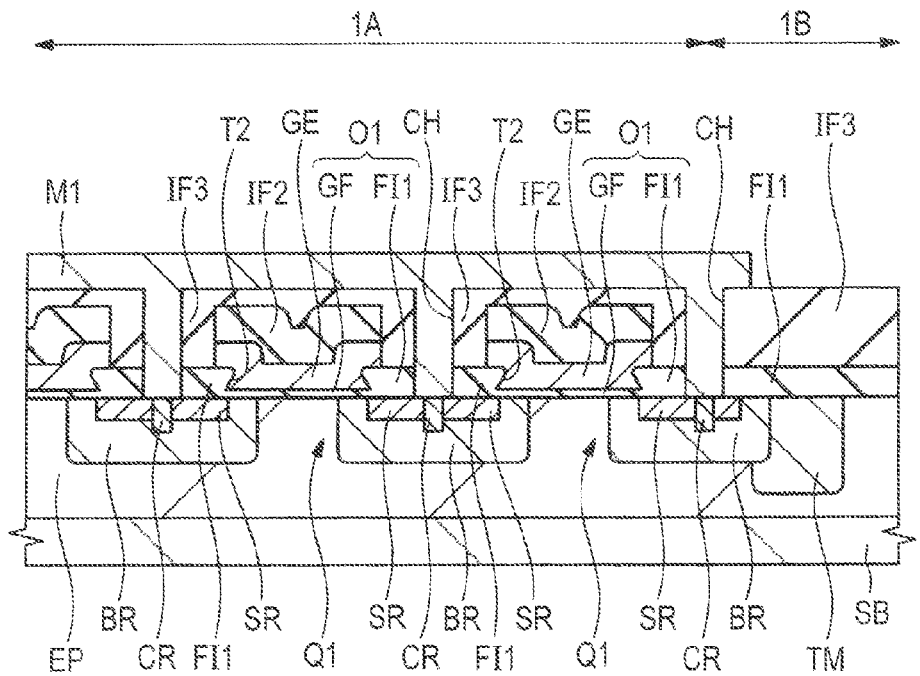
FIG. 12 is a sectional view showing a manufacturing method succeeding FIG. 11 of the semiconductor device.

Successively, as shown in FIG. 12, a metallic film M1 is formed over the SiC substrate SB by a sputtering method or the like. The metallic film M1 is comprised of aluminum (Al) for example. The metallic film M1 covers the upper surface of the interlayer insulating film IF3 and is embedded into the contact holes CH. Successively, the metallic film M1 in the termination region 1B is removed by a photolithography technology.

The upper surface of the metallic film M1 is a pat section to which a bonding wire or the like is coupled and the metallic film M1 embedded into each of the contact holes CH is a contact plug to supply a prescribed potential to the relevant MOSFET Q1. Each of the contact plugs is electrically coupled to the relevant contact region CR, the relevant source region SR, and the gate electrode GE through a silicide layer (not shown in the figure). Here, the metallic film M1 (not shown in the figure) to supply a potential to the gate electrode GE, and the metallic film M1 to supply a potential to the contact regions CR and the source regions SR are arranged in the manner of being separated and insulated from each other.

Figure 13:
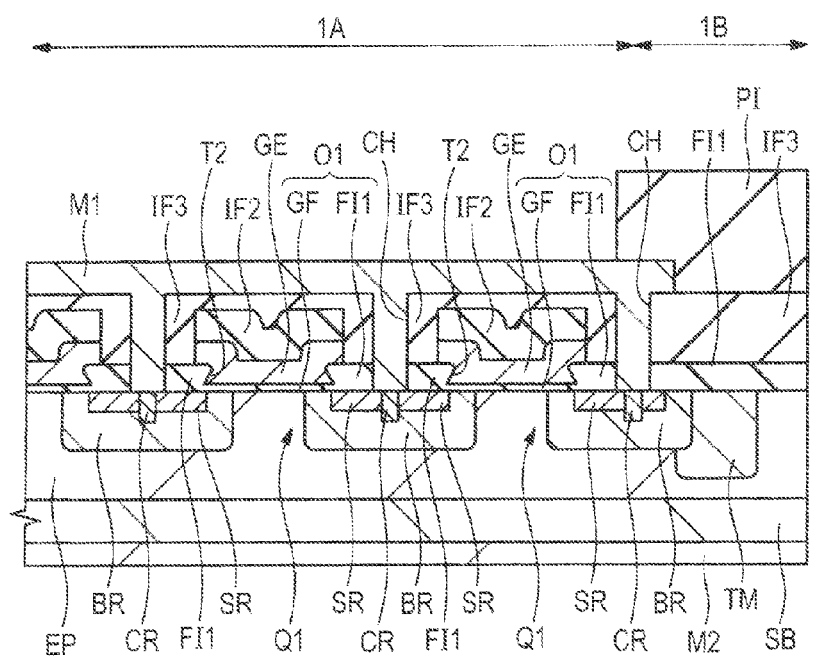
FIG. 13 is a sectional view showing a manufacturing method succeeding FIG. 12 of the semiconductor device.

Successively, as shown in FIG. 13, the upper part of the termination region 1B is covered with a protective film PI. The protective film PI is comprised of polyimide for example and covers the upper surface of the interlayer insulating film IF3 in the termination region 1B and the end of the metallic film M1 in the vicinity of the termination region 1B. That is, the protective film PI exposes a pad section of the metallic film M1 (not shown in the figure) for supplying electricity to the gate electrode GE and a pad section of the metallic film M1 for supplying electricity to the source regions SR and the contact regions CR.

Here, although it is not shown in the figure here, it is also possible to form a drain region of an $n^{++}$-type over the back surface of the SiC substrate SB by an ion implantation method for example after the step for forming the protective film PI for example. Further, although it is also not shown in the figure here, a silicide layer is formed so as to be in contact with the back surface of the SiC substrate SB. The silicide layer is formed by depositing a metallic film comprising Ni (nickel) or the like over the back surface of the SiC substrate SB, thereafter heating the metallic film with a laser, and making it react with the SiC substrate SB for example. The reason why the heat treatment is applied with a laser is to prevent a device such as a MOSFET Q1 from being overheated.

Successively, a metallic film M2 that is a drain electrode is formed so as to be in contact with the lower surface of the silicide layer. The metallic film M2 is a film formed by stacking an aluminum (Al) film and a gold (Au) film in sequence for example. Successively, the SiC substrate SB is cut and individualized by dicing and thereby a plurality of semiconductor chips are formed from one semiconductor wafer. In this way, a semiconductor device according to the present embodiment including a semiconductor chip is completed.

Figure 14:
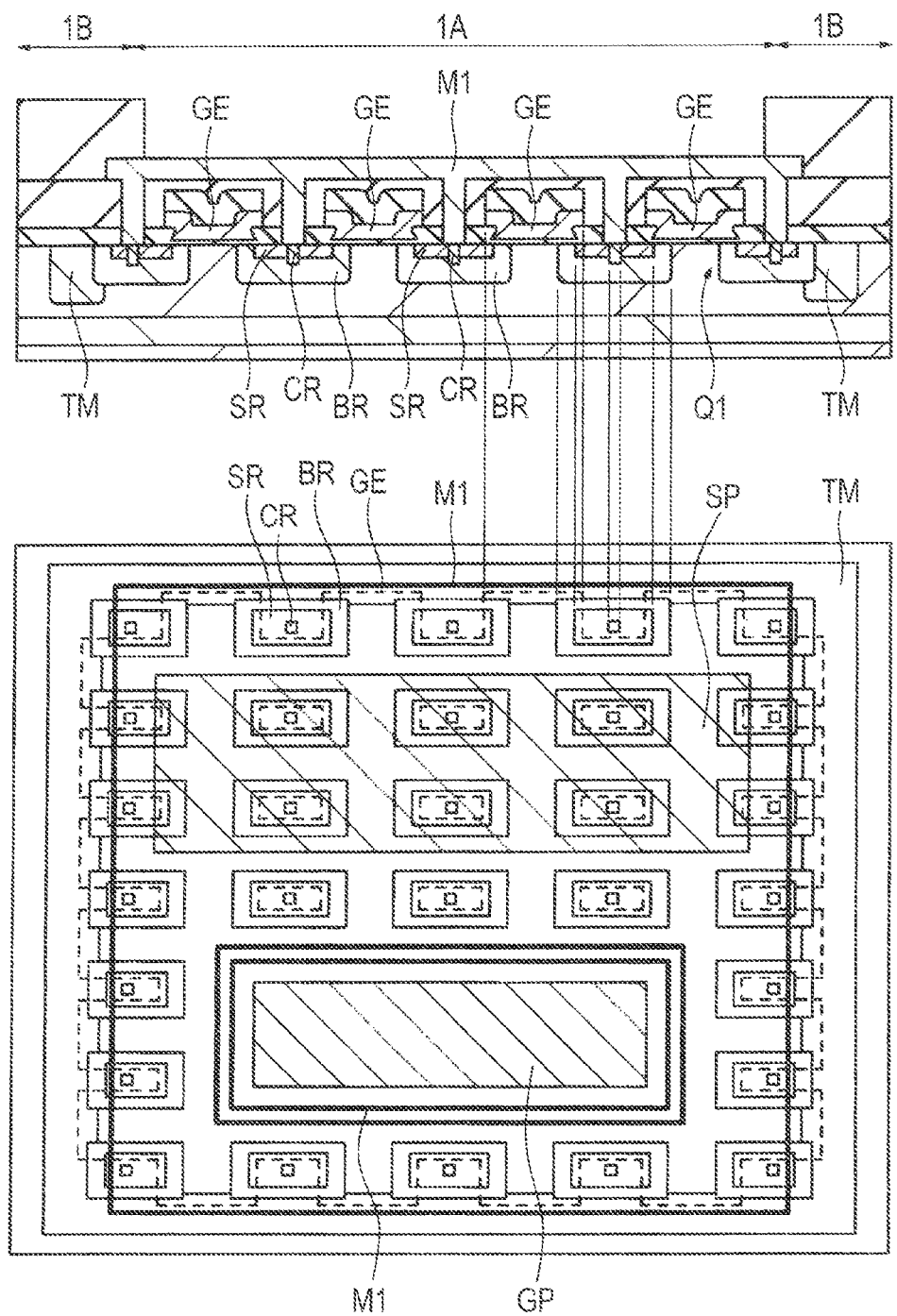
FIG. 14 shows a sectional view and a planar layout showing a semiconductor device according to Embodiment 1 of the present invention.

Here, a sectional view and a planar layout of a semiconductor chip according to the present embodiment are shown in FIG. 14. A sectional view of a semiconductor chip is shown on the upper side of FIG. 14 and a planar layout of the semiconductor chip at a position corresponding to the sectional view is shown under it. In the planar layout, in order to make the figure easy to understand, hatching is applied to a gate pad GP that is a pad section of a gate electrode GE and a source pad SP that is a pad section of a source electrode. Further, in the planar layout, the outline of the gate electrode GE is shown with broken lines.

Here, in the planar layout, the outlines of the metallic film M1 are shown with heavy solid lines. The metallic film M1 to supply a potential to the gate electrode GE is formed in the region where the gate pad GP in the figure is arranged and the metallic film M1 to supply a potential to the source regions SR is a region surrounding the gate pad GP and including the source pad SP and is formed right over all of the contact regions CR and the source regions SR.

As shown in the planar layout of FIG. 14, in the element region 1A, a plurality of element units each of which contains a body region BR, a source region SR, and a contact region CR are arranged side-by side in a matrix. No element unit is formed however right under the gate pad GP. The semiconductor region TM in the termination region 1B is formed annularly along the peripheral section of the rectangular semiconductor chip so as to surround the element region 1A in a planar view. Here, although each of the element units is shown in an oblong shape in FIG. 14, the shapes of the body region BR, the source region SR, and the contact region CR configuring each of the element units may also be squares in a planar view.

Figure 15:
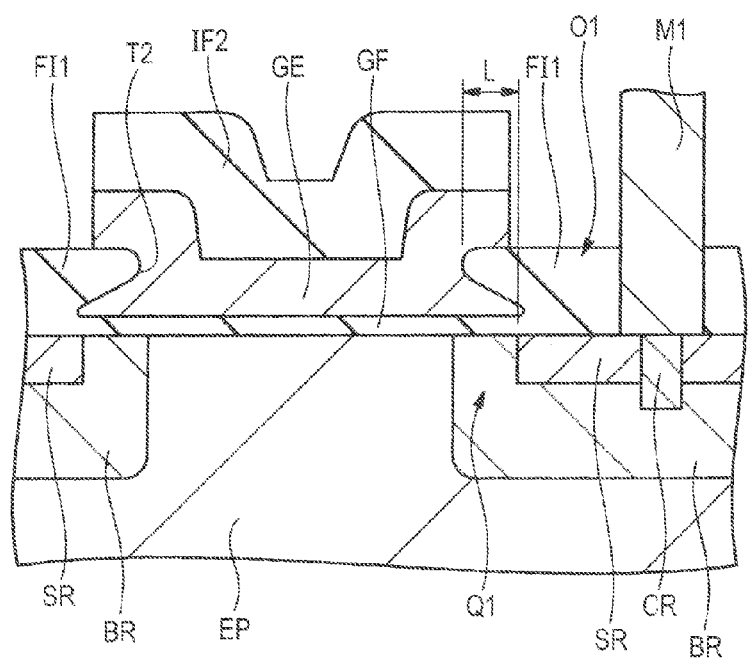
FIG. 15 is a sectional view enlargedly showing a semiconductor device according to Embodiment 1 of the present invention.
Figure 16:
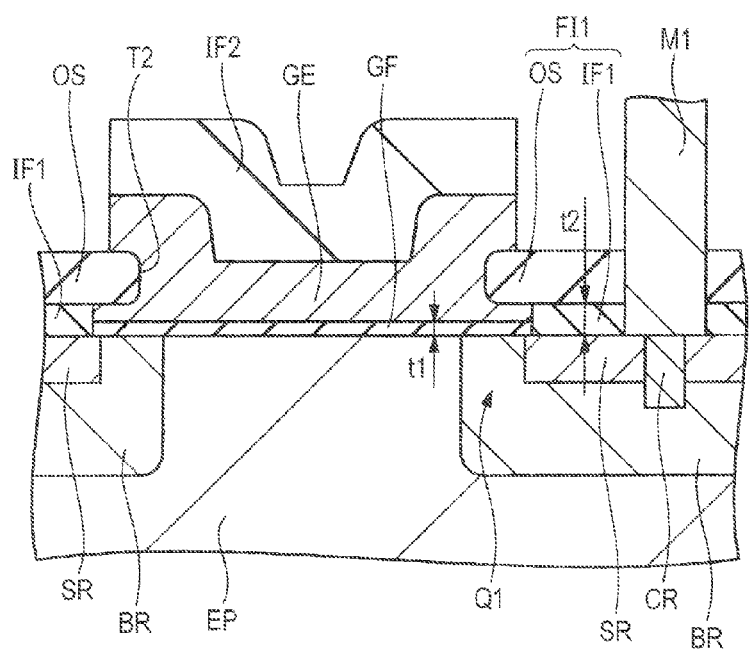
FIG. 16 is a sectional view enlargedly showing a semiconductor device according to Embodiment 1 of the present invention.

The effects of the manufacturing method of a semiconductor device according to the present embodiment and the effects of a semiconductor device according to the present embodiment are explained hereunder in reference to FIGS. 15 and 16 that are sectional views obtained by enlarging a part of the semiconductor device according to the present embodiment and FIGS. 21 to 24 that are sectional views explaining the steps for forming a semiconductor device according to a comparative example.

FIG. 15 is an enlarged sectional view showing a part of a completed semiconductor device, in particular showing a gate electrode GE in an active region and an oxide insulating film O1. FIG. 16 is an enlarged sectional view showing a part of a completed semiconductor device similarly to FIG. 15 and is a view explaining the structure by dividing an oxide insulating film O1 integrated by oxidation treatment at the step explained in reference to FIG. 8 into plural pieces. Here, an insulating film IF2 over the gate electrode GE, an interlayer insulating film IF3, and a part of a metallic film M1 are not shown in FIGS. 15 and 16.

As shown in FIG. 15, the sidewall of a field insulating film FI1 is formed so as to protrude laterally in an eaves-like shape and a part of a gate electrode GE is embedded into a recess under it. By applying a prescribed potential to the gate electrode GE, even to such a part of the gate electrode GE embedded under the eaves-like section, it is possible to: excite a carrier in a channel; and make a MOSFET Q1 on-state normally. Consequently, as long as the gate electrode GE is formed right over the whole upper surface of a body region BR exposed to the upper surface of an epitaxial layer EP adjacently to a source region SR, namely right over the whole upper surface of a channel region, with a gate insulating film GF interposed, it is possible to operate the MOSFET without difficulty.

That is, the fact that, right over the whole surface of the channel region, the terminal of the gate electrode GE in the lateral direction at the part being in contact with the gate insulating film GF exists closer to the body region BR than the boundary between the source region SR and the body region BR at the upper surface of the epitaxial layer EP causes the threshold voltage of the MOSFET Q1 to increase. Further, even when the gate electrode GE is formed right over the channel region, the problem of failing to normally operate the MOSFET Q1 arises if the thick field insulating film FI1 that is formed continuously from the upper surface of the epitaxial layer EP is formed and the gate electrode GE under the eaves-like section is not interposed in between.

This means that, as long as the gate electrode GE comes close right over the channel region with the gate insulating film GF interposed, no problem arises even when the gate electrode GE is not formed over the field insulating film FI1.

Consequently, no problem arises even when the gate electrode GE over the upper surface of the field insulating film FI1 terminates closer to the body region BR than the boundary between the body region BR and the source region SR at the upper surface of the epitaxial layer EP in the direction along the main surface of the SiC substrate SB as shown in FIG. 15.

The miniaturization of a semiconductor device is facilitated more as the terminal of the gate electrode GE over the field insulating film FI1 comes closer to the end of the upper surface of the field insulating film FI1. The reason is that, if the terminal of the gate electrode GE over the field insulating film FI1 is close to the end of the upper surface of the field insulating film FI1, it is possible to form a contact region CR and a metallic film M1 that is a contact plug coupled to the contact region CR closer to the gate electrode GE. Further, by bringing the contact plug close to the gate electrode GE in this way, the length of the source region SR between the site where the source region SR and the contact plug are coupled and the channel region reduces, thus the resistance in the source region SR can be reduced, and thereby the electric power consumption of the semiconductor device can be reduced.

It is however necessary to prevent the position of the terminal of the gate electrode GE from shifting into a groove T2 because of accuracy in the forming of the field insulating film FI1, accuracy in the processing of the gate electrode GE, or the like and hence the terminal of the gate electrode GE is located at a position sufficiently apart from the end of the upper surface of the field insulating film FI1 toward the side of the contact plug. The distance L in the direction along the main surface of the SiC substrate SB between the boundary between the channel region and the source region SR and the end of the field insulating film FI1 having the eaves-like section protruding right over the channel region is 150 nm for example.

In the present embodiment, since the gate electrode GE is embedded under the eaves by forming the field insulating film FI1 so as to have the end of an eaves-like inversely-tapered shape, it is possible to bring the terminal of the gate electrode GE over the upper surface of the field insulating film FI1 closer to the center of the groove T2. As a result, it is possible to: reduce the width of the gate electrode GE; bring the contact region CR and the contact plug closer to the channel region; and hence miniaturize the semiconductor device.

Further, in FIG. 16, insulating films configuring an oxide insulating film O1 are shown separately. A silicon oxide film IF1 having a film thickness larger than a gate insulating film GF and configuring the bottom part of a field insulating film FI1 is formed beside the gate insulating film GF. Further, a silicon oxide film OS that is an insulating film configuring the field insulating film FI1 and is formed by oxidizing a polysilicon film PS1 (refer to FIG. 7) is formed over the silicon oxide film IF1. The gate insulating film GF is an insulating film formed by partially oxidizing the upper surface of an epitaxial layer EP by the heat treatment explained in reference to FIG. 8.

The silicon oxide film IF1 is isotropically removed also in the lateral direction through the wet etching step explained in reference to FIG. 7 and hence the end of the silicon oxide film IF1 retracts closer to the contact plug than the end of the silicon oxide film OS over it. Further, the silicon oxide film OS is formed by oxidizing a polysilicon film PS1 (refer to FIG. 7) that is relatively thick and is comprised of silicon (Si) having a high oxidation rate and hence is formed so as to bulge in the lateral direction further than the polysilicon film PS1 before oxidized. Consequently, the end of the field insulating film FI1 comprising the silicon oxide films OS and IF1 has a shape protruding like an eaves at the sidewall of a groove T2. That is, the sidewall of the field insulating film FI1 overhangs right over the gate insulating film GF.

The gate insulating film GF having a film thickness t1 smaller than a film thickness t2 of the silicon oxide film IF1 is formed in contact with the upper surface of the epitaxial layer EP right under the end of the silicon oxide film OS protruding like an eaves in the lateral direction. Consequently, the end of the silicon oxide film OS protruding like an eaves and the gate insulating film GF right under it are separated from each other and a part of the gate electrode GE is embedded into a recess formed between them. That is, by reducing the film thickness t1 of the gate insulating film GF so as to be smaller than the film thickness t2 of the silicon oxide film IF1, it is possible to make the sidewall of the field insulating film FI1 have a more largely protruding eaves-like shape. As a result, it is possible to materialize the configuration of embedding a part of the gate electrode GE under the eaves section of the sidewall of the field insulating film FI1.

At the steps explained in reference to FIGS. 1 to 13, the explanations have been made on the premise that the film thickness of the gate insulating film GF is 50 nm for example and the film thickness of the silicon oxide film IF1 (refer to FIG. 5) is 20 nm for example. Even in such a configuration, the polysilicon film PS1 protruding like an eaves in FIG. 7 bulges in the lateral direction through a succeeding oxidation step and hence the eaves-like sidewall of the field insulating film FI1 is formed as shown in FIG. 15. The magnitude of the protrusion of the sidewall of the field insulating film FI1, namely the width of the gate electrode GE embedded under the eaves section, can be increased further by applying wet etching for a longer period of time for example at the step explained in reference to FIG. 7.

In contrast, if you want to embed the gate insulating film GF closer to the silicon oxide film IF1 right under the eaves section, it is conceivable to form the gate insulating film GF and the silicon oxide film IF1 having the relationship of t1<t2 as shown in FIG. 16. That is, the film thickness of the silicon oxide film IF1 may be increased to larger than 50 nm for example in order to materialize the configuration shown in FIG. 16. Otherwise, it is also possible to reduce the film thickness t1 of the gate insulating film GF and increase the film thickness t2 of the silicon oxide film IF1 so as to be larger than t1.

A manufacturing method of a semiconductor device, namely a method of forming a field insulating film only from an insulating film stacked over an epitaxial layer, and the problem are hereunder explained as a comparative example. FIGS. 21, 22, 23, and 24 used in the following explanations are sectional views, corresponding to FIGS. 5, 7, 8, and 13, in the manufacturing steps of a semiconductor device according to a comparative example.

In the comparative example, firstly the steps similar to the steps explained in reference to FIGS. 1 to 4 are applied.

Figure 21:
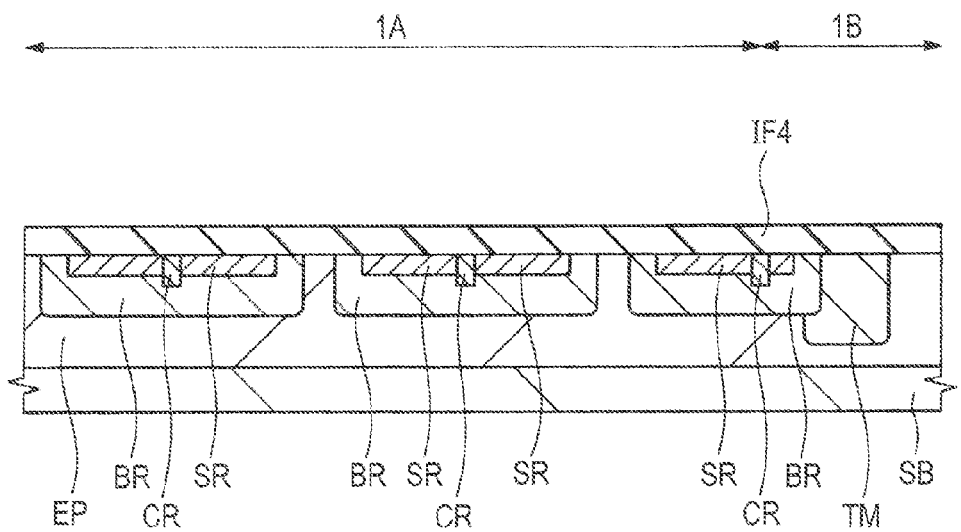
FIG. 21 is a sectional view showing a manufacturing method of a semiconductor device as a comparative example.

Successively, as shown in FIG. 21, a silicon oxide film IF4 having a film thickness of about 250 nm for example is formed over an epitaxial layer EP by a CVD method for example.

Figure 22:
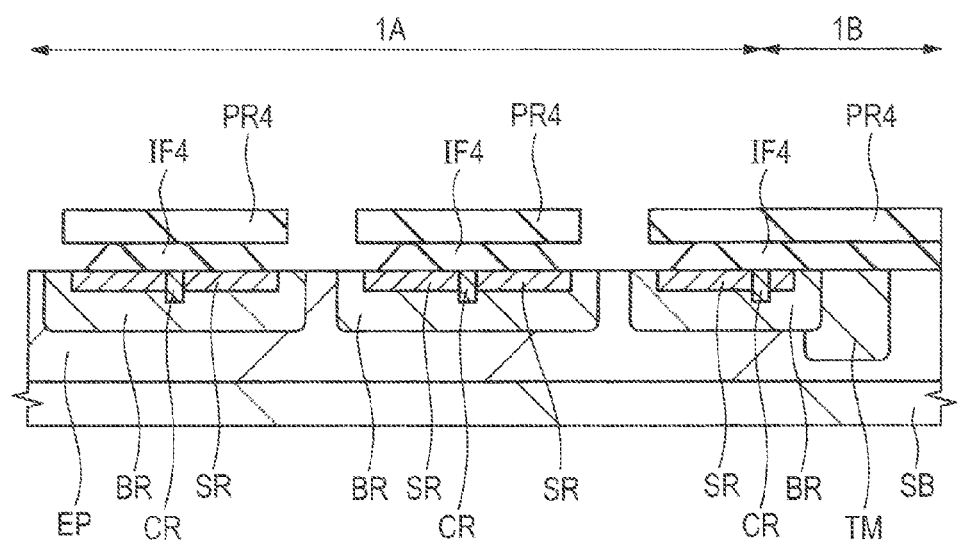
FIG. 22 is a sectional view showing a manufacturing method succeeding FIG. 21 of the semiconductor device.

Successively, as shown in FIG. 22, a pattern of a photoresist film PR4 is formed over the silicon oxide film IF4, wet etching is applied with the photoresist film PR4 used as a mask, thereby the silicon oxide film IF4 is opened, and thus the upper surface of the epitaxial layer EP is partially exposed. As a result, an active region where a gate electrode is embedded later and a field region on both the sides are specified.

At the wet etching step, since the silicon oxide film IF4 of a large film thickness is removed isotropically from the parts exposed at the bottoms of the openings of the photoresist film PR4, the sidewalls of the silicon oxide film IF4 under the photoresist film PR4 take a tapered shape. That is, the silicon oxide film IF4 has a trapezoidal shape of decreasing the width in the lateral direction from the lower surface toward the upper surface. In other words, the width of each of the openings of the silicon oxide film IF4 increases toward the upper part. The silicon oxide film IF4 is an insulating film that is to be a field insulating film and the sidewalls do not take an eaves-like inversely-tapered shape unlike the present embodiment.

Further, at the wet etching step, since the silicon oxide film IF4 of a large film thickness is removed isotropically from the upper surface, the magnitude of the retraction of the silicon oxide film IF4 in the lateral direction increases comparatively. In the case where the magnitude of the retraction increases because the film thickness of the silicon oxide film IF4 processed by wet etching is large, the positional variation of the terminal of the silicon oxide film IF4 processed by wet etching intrinsically having a low processing accuracy increases further. Here, since to form the silicon oxide film IF4 that is a field insulating film right over the channel regions adjacent to the source regions SR causes the malfunction of a MOSFET, it is necessary to prevent: the position of the terminal of the silicon oxide film IF4 processed by wet etching having a low processing accuracy from varying; and the channel regions and the silicon oxide film IF4 from overlapping with each other.

In order to secure an allowance to the variation, it is necessary to form the ends of the silicon oxide film IF4 so as to be separated largely from the boundaries between the channel regions and the source regions SR toward the side of the source regions SR, respectively.

Furthermore, at the wet etching step, the sidewall of the silicon oxide film IF4 takes a tapered shape and the area of the upper surface of the silicon oxide film IF4 comes to be smaller than the area of the lower surface of the silicon oxide film IF4. Consequently, the joint strength between the upper surface of the silicon oxide film IF4 and the photoresist film PR4 over it weakens and there is the danger that the photoresist film PR4 peels off from the upper surface of the silicon oxide film IF4 during the wet etching step. On this occasion, since the exposed upper surface of the silicon oxide film IF4 retracts also by the wet etching, an arising problem is that the silicon oxide film IF4 cannot secure a film thickness necessary as a field insulating film.

It is necessary therefore to expand the width of the silicon oxide film IF4 in order to prevent the photoresist film PR4 from peeling off. On this occasion, since the widths in the lateral direction of the source regions SR and the body regions BR right under the silicon oxide film IF4 have also to be expanded, another arising problem is that the area of the semiconductor device increases.

Figure 23:
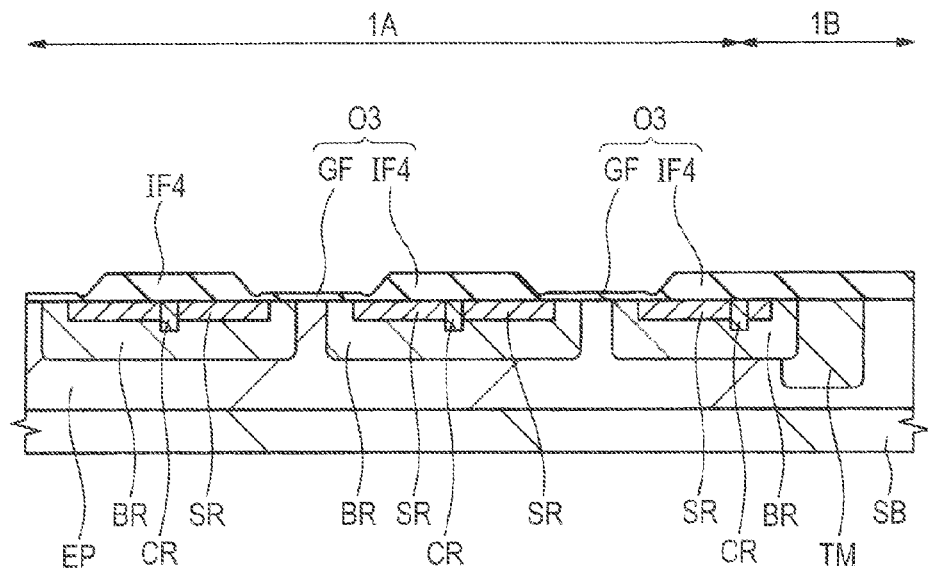
FIG. 23 is a sectional view showing a manufacturing method succeeding FIG. 22 of the semiconductor device.

Successively, as shown in FIG. 23, after the photoresist film PR4 is removed, a gate insulating film GF is formed over the upper surface of the epitaxial layer EP in the active region exposed from the silicon oxide film IF4 by applying heat treatment. As a result, an oxide insulating film O3 including the gate insulating film GF and the silicon oxide film IF4 being formed on both the sides and having a film thickness larger than the gate insulating film GF is formed.

On this occasion, a recess is formed over the upper surface of the oxide insulating film O3 at the boundary between the gate insulating film GF and the silicon oxide film IF4, those being in contact with each other. The film thickness of the oxide insulating film O3 right under the recess is smaller than the film thickness of the gate insulating film GF at the center section of the active region. The recess is caused by the fact that the silicon oxide film formed over the upper surface of the epitaxial layer EP in the vicinity of the silicon oxide film IF4 having a tapered shape is not formed thicker than the silicon oxide film formed over the upper surface of the epitaxial layer EP at the center section of the active region.

Figure 24:
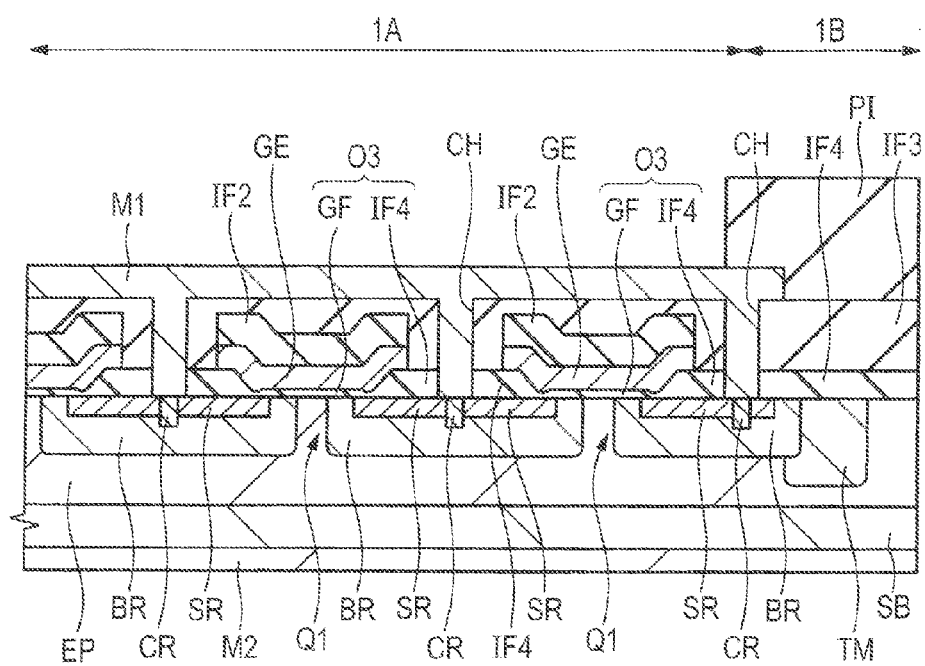
FIG. 24 is a sectional view showing a manufacturing method succeeding FIG. 23 of the semiconductor device.

Successively, as shown in FIG. 24, a semiconductor device according to the comparative example including MOSFETs Q1 is formed by applying the steps similar to the steps explained in reference to FIGS. 9 to 13. On this occasion, parts of the gate electrode GE are embedded into the recesses at both the ends of the upper surface of the gate insulating film GF. In this case, since the gate electrode GE is formed excessively close to the source regions SR, the insulating film having a low withstanding voltage exists locally between the gate electrode GE and the epitaxial layer EP and that causes the insulation breakdown of the gate insulating film GF at the sites where the recesses are formed. If the gate insulating film GF is destroyed thereby, the semiconductor device cannot be used anymore.

Further, at the step of forming the gate electrode GE by processing the polysilicon film (the step corresponding to FIG. 10), it is necessary to terminate the gate electrode GE over the field insulating film having a film thickness necessary to easily process the gate electrode GE. In this regard, since the film thickness of the sidewalls of the silicon oxide film IF4 having a tapered shape is small, it is necessary to avoid the termination of the gate electrode GE right over the tapered parts from the viewpoint of processing the gate electrode GE easily. Consequently, it is necessary to terminate the gate electrode GE at uppermost parts of the tapered parts of the sidewalls of the silicon oxide film IF4, namely at positions sufficiently separated from the ends of the upper surfaces of the silicon oxide film IF4, in the direction away from the active region right under it.

Thus in the semiconductor device according to the comparative example, the area occupied by elements increases, the miniaturization and higher integration of a semiconductor chip are hardly attained, and hence there is the problem of deteriorating the performance of the semiconductor device. The problem is caused by the fact that it is necessary to form the ends of the silicon oxide film IF4 away from the channel regions because the sidewalls of the silicon oxide film IF4 are tapered, thus the width of the silicon oxide film IF4 increases, and the positions where the sidewalls of the silicon oxide film IF4 are formed vary largely. Further, the problem is further caused by the fact that it is necessary to expand the width of the silicon oxide film IF4 in order to prevent the photoresist film PR4 from peeling off and the positions where the gate electrode GE terminates get away from the active region because the silicon oxide film IF4 is tapered.

Further, to increase the width of the silicon oxide film IF4 as stated above means to increase the width in the lateral direction of each of the source regions SR interposed between the body region BD that is to be a channel region and the contact region CR under it. Since each of the source regions SR is a semiconductor layer having a high resistance value, the increase of the width of the source region SR causes the resistance of a MOSFET to increase. Consequently, in the semiconductor device according to the comparative example, there is the problem of deteriorating the performance of the semiconductor device by increasing the electric power consumption of the MOSFET.

By a manufacturing method according to the present embodiment in contrast, unlike the comparative example, as explained in reference to FIGS. 5 to 7, the silicon oxide film IF1 having a film thickness smaller than the polysilicon film PS1 is opened by a wet etching method with the pattern of the polysilicon film PS1 processed by a dry etching method used as a mask and thereby the active region where the gate insulating film is formed is specified. Here, since the upper surface of the epitaxial layer EP is exposed through the wet etching step (refer to FIG. 7), it is possible to prevent the upper surface of the epitaxial layer EP from being damaged.

At the wet etching step, since the silicon oxide film IF1 having a smaller film thickness in comparison with the comparative example is processed, it is possible to reduce the magnitude and the variation of retraction of the silicon oxide film IF1 even when a wet etching method of a low processing accuracy is used. That is, it is possible to improve the accuracy of the wet etching. Consequently, it is unnecessary to form the ends of the silicon oxide film IF1, namely the ends of the field insulating film FI1, largely away from the boundaries between the channel regions and the source regions SR of the MOSFETs toward the side of the source regions SR in consideration of the low accuracy of the wet etching. Further, since it is unnecessary to take the variation of the opening positions of the field insulating film FI1 caused by the low accuracy of the wet etching into consideration, it is possible to bring the positions of the terminals of the gate electrode GE closer to the active region. As a result, it is possible to miniaturize the semiconductor device.

Further, since the film thickness of the silicon oxide film IF1 is much smaller than that of the polysilicon film PS1 that is to be the field insulating film together with the silicon oxide film IF1 at a succeeding step, it is possible to prevent the sidewalls of the silicon oxide film IF1 from being formed in a tapered shape. As a result, it is possible to prevent the width of the MOSFETs from increasing because the sidewalls of the thick silicon oxide film IF4 (refer to FIG. 22) that is the field insulating film is tapered like the comparative example.

Furthermore, at the step explained in reference to FIG. 7, since the width of the upper surface of the silicon oxide film IF1 processed by a wet etching method never comes to be extremely smaller than the width of the lower surface, it is possible to prevent the film formed over the silicon oxide film IF1 and used as a mask at the wet etching step, namely the polysilicon film PS1, from being likely to peel off.

In addition, since an insulating film having a sufficiently large film thickness cannot be formed in the field region only by the silicon oxide film IF1, in the present embodiment, the field insulating film FI1 having a film thickness larger than the gate insulating film GF shown in FIG. 8 is formed by forming the polysilicon film PS1 having a film thickness larger than the silicon oxide film IF1 over the silicon oxide film IF1 and apply heat treatment to it. That makes it possible, in the oxide insulating film O1, to: form the gate insulating film GF of a small film thickness in the active region; and form the field insulating film FI1 of a large film thickness in the field region.

In this way, it is possible to specify the active region with a high degree of accuracy by combining dry etching to process the polysilicon film PS1 and wet etching to process the silicon oxide film IF1. Consequently, it is possible to terminate the gate electrode GE that has to be overlapped with the channel regions in a planar view, namely the gate electrode GE being in contact with the gate insulating film GF in the active region, at desired positions with a high degree of accuracy. As a result, it is possible to reduce the distance from the boundary between each of the source regions SR and the relevant channel region to the relevant end of the gate electrode GE being in contact with the gate insulating film GF. It is thereby possible to: reduce the width of the MOSFETs Q1; and hence improve the performance of the semiconductor device.

A semiconductor device according to the present embodiment manufactured by the aforementioned method has the following effects.

That is, as shown in FIG. 13, the sidewalls of the field insulating film FI1 do not have such a tapered shape as to increase the opening width of the field insulating film FI1 upward and the ends of the field insulating film FI1 adjacent to the active region have a film thickness necessary for easily processing the gate electrode GE. As a result, it is unnecessary to terminate the gate electrode GE at positions sufficiently apart from the active region and it is possible to terminate the gate electrode GE in the vicinities of the ends of the field insulating film FI1. In other words, it is possible to move the ends of the gate electrode GE closer to the center of the gate electrode GE. Further, since the sidewalls of the field insulating film FI1 do not have such a tapered shape as the comparative example, it is possible to prevent the width of the field insulating film FI1 from increasing.

Further, the gate electrode GE embedded under the eaves sections of the sidewalls of the field insulating film FI1 can be used for normally turning the MOSFETs Q1 to an on-state by applying a prescribed potential. Furthermore, in consideration of the processing accuracy of the gate electrode GE explained in reference to FIG. 10, all one need to do is to place the terminals of the gate electrode GE at positions to some extent apart from the ends of the upper surface of the field insulating film FI1. As a result, as shown in FIG. 15, each of the terminals of the gate electrode GE right over the field insulating film FI1 is not necessarily located closer to the field region than the relevant end of the active region, the relevant end of the gate insulating film GF, the boundary between the relevant channel region and the relevant source region SR, or the end of the part of the gate electrode GE embedded under the relevant eaves section.

As shown in FIG. 15, the gate electrode GE over the field insulating film FI1 terminates right over the channel regions. That is, the gate electrode GE over the upper surface of the field insulating film FI1 may terminate in the regions closer to the active region than the source regions SR in the direction along the main surface of the SiC substrate SB. As a result, it is possible to reduce the width of the whole gate electrode GE.

When the width of the eaves-like shape of the sidewalls of the field insulating film FI1 protruding from the ends of the bottom surface of the field insulating film FI1 in the lateral direction is small, the gate electrode GE terminates in the field region, but on this occasion too it is possible to reduce the width of the gate electrode GE in comparison with the comparative example, and hence it is possible to reduce the distance from each of the boundaries of the active region and the field region to the relevant end of the gate electrode GE. As a result, it is possible to: reduce the width of the gate electrode GE; and miniaturize the MOSFETs Q1 even when the width of the region between two source regions SR adjacent to each other with the relevant channel region interposed, namely the width of the active region, is not changed in comparison with the comparative example.

Further, it is possible to arrange the contact regions CR and the contact plugs comprising the metallic film M1 at positions close to the active region to the extent of reducing the width of the gate electrode GE as stated above. As a result, it is possible to reduce the width of the field region between two parts of the gate electrode GE adjacent to each other.

In this way, it is possible to: reduce the area occupied by elements; miniaturize and highly integrate the semiconductor chip; and hence improve the performance of the semiconductor device.

Further, as stated above, it is possible to: arrange the contact regions CR and the contact plugs comprising the metallic film M1 at positions close to the active region; and hence reduce the width of each of the source regions SR ranging from the end of the source region SR coupled to the relevant contact plug to the end of the source region SR on the opposite side, namely the end of the source region SR being in contact with the relevant channel. As a result, it is possible to: reduce the electric current route in the source regions SR having a high resistance value; and hence reduce the power consumption of the MOSFETs Q1. Consequently, it is possible to improve the performance of the semiconductor device.

Further, since the sidewalls of the field insulating film FI1 shown in FIG. 13 have an inversely-tapered eaves-like shape, it is possible to prevent recesses from forming over the upper surface of the gate insulating film GF adjacent to the sidewalls at the bottoms of the grooves T2. That is, since it is possible to keep the film thickness of the whole gate insulating film GF uniform, it is possible to prevent: the film thickness of the ends of the gate insulating film GF from reducing; and withstanding voltage from reducing locally between the gate electrode GE and the epitaxial layer EP unlike the comparative example. As a result, it is possible to: improve the withstanding voltage of the MISFETs Q1; and hence improve the performance of the semiconductor device.

Furthermore, it is possible to improve the performance of the semiconductor device by embedding the lower sections of the gate electrode GE under the eaves sections of the sidewalls of the field insulating film FI1, thus fixing the gate electrode GE, making the gate electrode GE hardly peel off from above the epitaxial layer EP, and increasing the mechanical strength of the gate electrode GE.

Embodiment 2

A configuration of changing the angle of the eaves-like sidewalls of the field insulating film in a MOSFET explained in Embodiment 1 so as to be more vertical to the main surface of a substrate is explained hereunder in reference to FIGS. 17 to 20. FIGS. 17 to 20 are sectional views explaining the manufacturing method of a semiconductor device according to the present embodiment.

In the manufacturing step of a semiconductor device according to the present embodiment, firstly the steps similar to those explained in reference to FIGS. 1 to 7 are applied. That is, as shown in FIG. 7, after a laminated film is formed by forming a silicon oxide film IF1 and a polysilicon film PS1 in sequence over an epitaxial layer EP over an SiC substrate SB, the laminated film is opened and the upper surface of the epitaxial layer EP is exposed.

Figure 17:
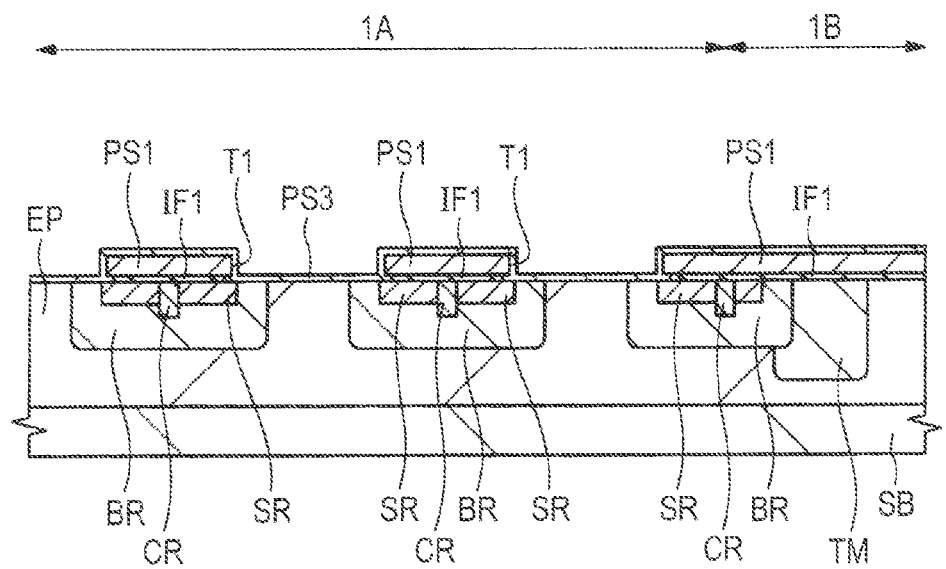
FIG. 17 is a sectional view showing a manufacturing method of a semiconductor device according to Embodiment 2 of the present invention.

Successively, as shown in FIG. 17, a polysilicon film PS3 is formed over the epitaxial layer EP so as to cover the silicon oxide film IF1 and the polysilicon film PS1 by a CVD method for example. The polysilicon film PS3 is a semiconductor film comprising a silicon (Si) film having an oxidation rate larger than silicon carbide (SiC). The film thickness of the polysilicon film PS3 is 10 nm for example and hence the polysilicon film PS3 never completely fills grooves T1 that are openings of the polysilicon film PS1. The polysilicon film PS3 covers the upper surface and the sidewalls of the polysilicon film PS1 and further covers the upper surface of the epitaxial layer EP under the grooves T1 and the sidewalls of the silicon oxide film IF1.

Further, the polysilicon film PS3 completely fills recesses right under the ends of the polysilicon film PS1 protruding closer to the centers of the grooves T1 than the sidewalls of the silicon oxide film IF1. That is, the polysilicon film PS3 is embedded between the ends of the polysilicon film PS1 and the upper surface of the epitaxial layer EP. As a result, the sidewalls of the polysilicon film PS3 in the grooves T1 do not take an eaves-like shape and are formed at an angle closer to an angle vertical to the upper surface of the epitaxial layer EP. The polysilicon film PS3 can completely fill the recesses as long as the film thickness of the polysilicon film PS3 is not less than a half of the film thickness of the silicon oxide film IF1.

Figure 18:
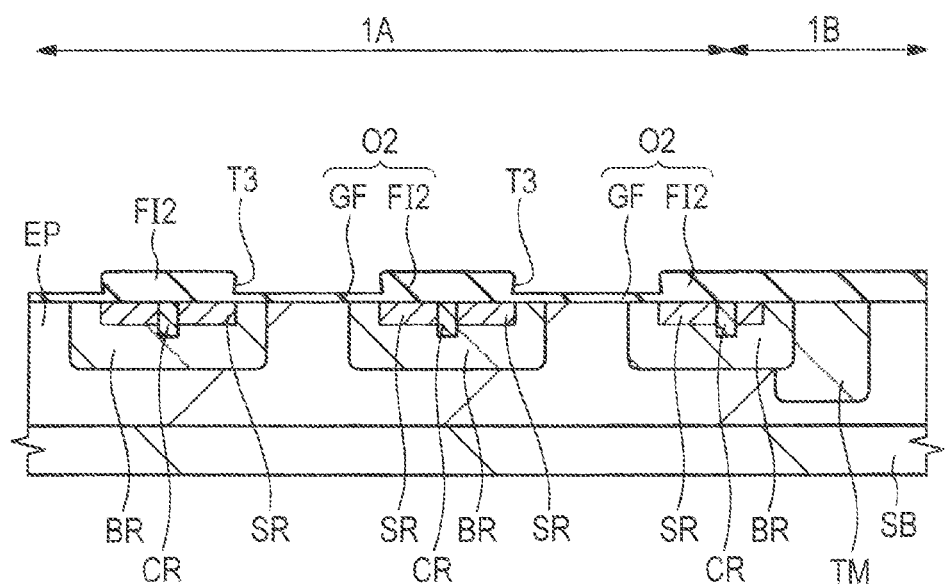
FIG. 18 is a sectional view showing a manufacturing method succeeding FIG. 17 of the semiconductor device.

Successively, as shown in FIG. 18, the polysilicon films PS1 and PS3 are oxidized by applying heat treatment similarly to the step explained in reference to FIG. 8. As a result, in an active region, the polysilicon film PS3 being in contact with the upper surface of the epitaxial layer EP is oxidized and a gate insulating film GF of about 50 nm in thickness is formed. Further, in a field region interposing the active region, a field insulating film FI2 including a silicon oxide film formed by oxidizing the polysilicon films PS1 and PS3 and a silicon oxide film IF1 (refer to FIG. 17) is formed. The gate insulating film GF and the field insulating film FI2 are integrated with each other and configure an oxide insulating film O2.

Grooves T3 are formed at positions corresponding to the grooves T1 (refer to FIG. 17) between adjacent parts of the field insulating film FI2 and the gate insulating film GF is formed at the bottoms of the grooves T3. The sidewalls of the field insulating film FI2 have an inversely-tapered shape but are formed at an angle closer to an angle vertical to the upper surface of the epitaxial layer EP than the sidewalls of the field insulating film FI1 (refer to FIG. 8) explained in Embodiment 1.

This is because the gaps under the eaves sections at the ends of the polysilicon film PS1 are filled with the polysilicon film PS3 at the step explained in reference to FIG. 17. Here, at the oxidation step by heat treatment, since the silicon oxide film formed by oxidizing the whole polysilicon film PS1 having a relatively large film thickness expands in the lateral direction, the sidewalls of the grooves T3 take an inversely-tapered shape. That is, the width of the grooves T3 reduces upward.

Figure 19:
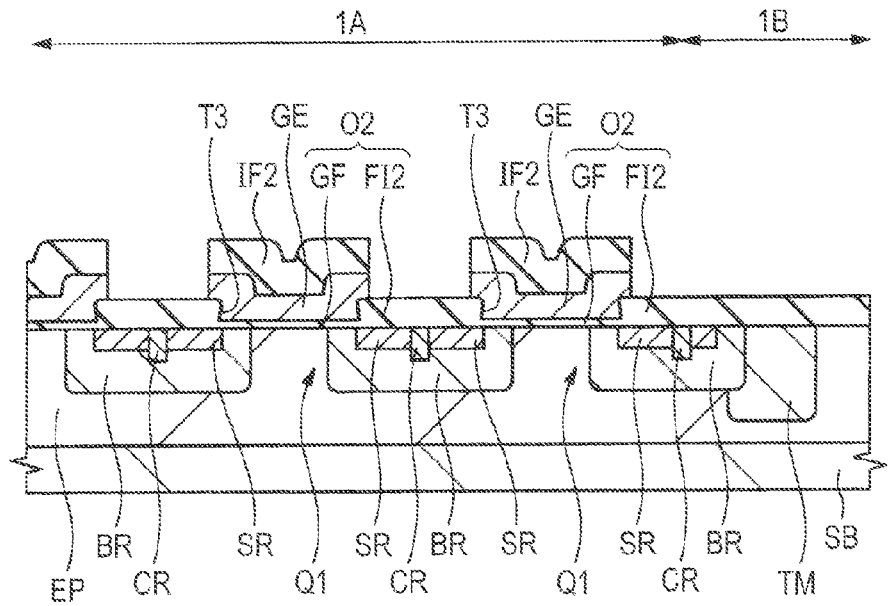
FIG. 19 is a sectional view showing a manufacturing method succeeding FIG. 18 of the semiconductor device.

Successively, as shown in FIG. 19, by applying steps similar to the steps explained in reference to FIGS. 9 and 10, the patterns of a gate electrode GE and an insulating film IF2 are formed over the active region and the oxide insulating film O2 in the vicinity. The gate electrode GE fills the grooves T3 and is in contact with the upper surface of the gate insulating film GF. That is, the gate electrode GE is embedded between the ends of the field insulating film FI2 formed in an eaves-like shape and the gate insulating film GF right under it.

Figure 20:
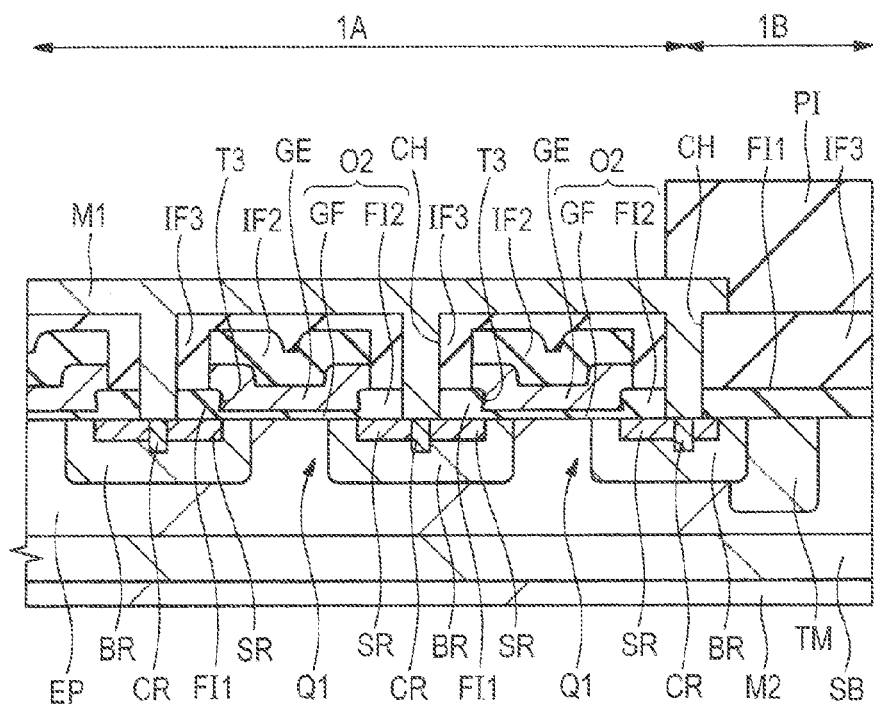
FIG. 20 is a sectional view showing a manufacturing method succeeding FIG. 19 of the semiconductor device.

Successively, as shown in FIG. 20, by applying steps similar to the steps explained in reference to FIGS. 11 to 13, a semiconductor device according to the present embodiment having a plurality of MOSFETs Q1 including the gate electrode GE is formed. In the present embodiment, since the ends of the field insulating film FI2 have an inversely-tapered shape, it is possible to obtain effects similar to Embodiment 1.

Further, the sidewalls of the field insulating film FI2 according to the present embodiment are formed in a direction closer to the direction vertical to the upper surface of the epitaxial layer EP than Embodiment 1. As a result, by the heat treatment, it is possible to form the gate insulating film GF having a more uniform film thickness over the upper surface of the epitaxial layer EP at the bottoms of the grooves T3. Further, since the gate insulating film GF is formed by applying oxidation treatment not to the upper surface of the epitaxial layer EP but to the deposited polysilicon film PS3 (refer to FIG. 17) here, it is possible to: form the gate insulating film GF having a uniform film thickness; and prevent recesses from being formed at the ends of the gate insulating film GF. As a result, it is possible to: increase the withstanding voltage of the MOSFETs Q1; thus improve the performance of the semiconductor device; and prevent the insulation breakdown of the gate insulating film GF.

Here, when the eaves sections of the sidewalls of the field insulating film are formed so as to protrude largely toward the active regions, the parts of the gate electrode embedded right under the eaves sections have a small film thickness and take an acicular shape of an acute angle in a sectional view. A problem arising on this occasion is that an electric field concentrates on the parts of the gate electrode embedded right under the eaves sections and insulation breakdown tends to occur. Further in this case, it is concerned that a mechanical stress concentrates on the parts of the gate electrode embedded right under the eaves sections and the gate electrode is destroyed.

In the present embodiment in contrast, the sidewalls of the field insulating film FI2 are formed at an angle close to the vertical direction and hence it is possible to prevent an electric field from concentrating on the gate electrode GE right under the eaves sections. As a result, it is possible to: prevent insulation breakdown from occurring; increase the withstanding voltage of the MOSFETs Q1; and hence improve the performance of the semiconductor device. Further, since the sidewalls of the field insulating film FI2 are formed at an angle close to the vertical direction, it is possible to prevent a stress from concentrating on the gate electrode GE right under the eaves sections. As a result, it is possible to: increase the strength of the gate electrode GE; and hence improve the performance of the semiconductor device.

Although the invention established by the present inventors has heretofore been explained concretely on the basis of the embodiments, it goes without saying that the present invention is not limited to the embodiments and can be modified variously within the scope not departing from the tenor of the present invention.

What is claimed is:

1. A manufacturing method of a semiconductor device comprising the steps of:
   (a) providing a substrate of a first conductivity type containing silicon carbide;
   (b) forming a semiconductor layer of the first conductivity type containing silicon carbide over the substrate;
   (c) forming a first semiconductor region and a second semiconductor region of a second conductivity type different from the first conductivity type, and a third semiconductor region of the first conductivity type between the first semiconductor region and the second semiconductor region over an upper surface of the semiconductor layer;
   (d) forming a fourth semiconductor region of the first conductivity type in the first semiconductor region and a fifth semiconductor region of the first conductivity type in the second semiconductor region;
   (e) after the step (d), forming a first semiconductor film over the semiconductor layer;
   (f) forming a patterned first semiconductor film covering the fourth semiconductor region and the fifth semiconductor region and removing the first semiconductor film over the third semiconductor region, a part of the first semiconductor region and a part of the second semiconductor region;
   (g) after the step (f), forming a gate insulating film over the semiconductor layer by oxidation treatment, and forming a first insulating film by oxidizing the patterned first semiconductor film, over the fourth semiconductor region and the fifth semiconductor region; and
   (h) forming a gate electrode over the gate insulating film between the first insulating film over the fourth semiconductor region and the first insulating film over the fifth semiconductor region,
   wherein a thickness of the first insulating film is larger than that of the gate insulating film.

2. A manufacturing method of a semiconductor device according to claim 1, further comprising the steps of:
   (i) between the step (d) and the step (e), forming a second insulating film over the semiconductor layer; and
   (j) between the step (f) and the step (g), removing the second insulating film exposed from the patterned first semiconductor film by a wet etching method.

3. A manufacturing method of a semiconductor device according to claim 2,
   wherein, at the step (j), the sidewall of the second insulating film retracts from the sidewall of the patterned first semiconductor film in the direction along the upper surface of the semiconductor layer.

4. A manufacturing method of a semiconductor device according to claim 2,
   wherein the first semiconductor film formed in the step (e) has a film thickness larger than the second insulating film.

5. A manufacturing method of a semiconductor device according to claim 2,
   wherein the film thickness of the second insulating film formed in the step (i) is larger than the film thickness of the gate insulating film.

6. A manufacturing method of a semiconductor device according to claim 1, further comprising a step of:
   (k) forming contact plugs electrically coupled to the fourth semiconductor region and the fifth semiconductor region over the semiconductor layer beside the gate electrode.

7. A manufacturing method of a semiconductor device according to claim 1,
   wherein the gate electrode extends over the first insulating film.

8. A manufacturing method of a semiconductor device according to claim 1,
   wherein the step (g) includes the step of:
   (g1) forming a second semiconductor film over the upper surface of the semiconductor layer before the oxidation treatment.

9. A manufacturing method of a semiconductor device according to claim 1,
wherein the fourth semiconductor region and third semiconductor region configure a source region and a drain region of a field effect transistor including the gate electrode respectively.

* * * * *